(12) United States Patent
Simsek-Ege et al.

(10) Patent No.: US 11,222,975 B2
(45) Date of Patent: Jan. 11, 2022

(54) MEMORY ARRAYS WITH VERTICAL TRANSISTORS AND THE FORMATION THEREOF

(71) Applicant: Micron Technology, Inc., Boise, ID (US)

(72) Inventors: Fatma Arzum Simsek-Ege, Boise, ID (US); Steve V. Cole, Boise, ID (US); Scott J. Derner, Boise, ID (US); Toby D. Robbs, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 167 days.

(21) Appl. No.: 16/522,390

(22) Filed: Jul. 25, 2019

(65) Prior Publication Data
US 2021/0028308 A1    Jan. 28, 2021

(51) Int. Cl.
| | | |
|---|---|---|
| H01L 29/78 | (2006.01) | |
| H01L 29/66 | (2006.01) | |
| H01L 27/108 | (2006.01) | |
| H01L 27/11587 | (2017.01) | |
| G11C 11/22 | (2006.01) | |
| G11C 11/4091 | (2006.01) | |

(52) U.S. Cl.
CPC ........ *H01L 29/7827* (2013.01); *G11C 11/223* (2013.01); *G11C 11/4091* (2013.01); *H01L 27/1085* (2013.01); *H01L 27/10823* (2013.01); *H01L 27/10876* (2013.01); *H01L 27/10882* (2013.01); *H01L 27/11587* (2013.01); *H01L 29/66666* (2013.01)

(58) Field of Classification Search
CPC .......... H01L 29/7827; H01L 29/66666; H01L 27/10823; H01L 27/1085; H01L 27/10876; H01L 27/11587; H01L 27/10882; H01L 27/10885; H01L 27/10811; H01L 27/10855; H01L 27/10814; H01L 29/78642; G11C 11/223; G11C 11/4091; G11C 11/2273; G11C 11/4063; G11C 5/06; G11C 5/02
See application file for complete search history.

(56) References Cited

U.S. PATENT DOCUMENTS

| | | | |
|---|---|---|---|
| 6,456,521 B1 | 9/2002 | Hsu et al. | |
| 9,472,252 B2 | 10/2016 | Hofstetter et al. | |
| 10,103,053 B1* | 10/2018 | Sukekawa | ......... H01L 21/76898 |
| 10,243,040 B1* | 3/2019 | Park | ...................... H01L 29/732 |
| 2009/0175066 A1 | 7/2009 | Kim | |
| 2012/0040528 A1* | 2/2012 | Kim | .................... H01L 21/0338 |
| | | | 438/675 |
| 2020/0111800 A1* | 4/2020 | Ramaswamy | .... H01L 27/10873 |

* cited by examiner

*Primary Examiner* — Thanh T Nguyen
(74) *Attorney, Agent, or Firm* — Brooks, Cameron & Huebsch, PLLC

(57) ABSTRACT

An apparatus, such as a memory array, can have a memory cell coupled to a first digit line (e.g., a local digit line) at a first level. A second digit line (e.g., hierarchical digit line) at a second level can be coupled to a main sense amplifier. A charge sharing device at a third level between the first and second levels can be coupled to the first digit line and to a connector. A vertical transistor at the third level can be coupled between the first digit line and the connector. A contact can be coupled between the connector and the second digit line.

17 Claims, 25 Drawing Sheets

MEMORY ARRAYS WITH VERTICAL TRANSISTORS AND THE FORMATION THEREOF

TECHNICAL FIELD

The present disclosure relates generally to memory devices, and more particularly, to memory arrays with vertical transistors and the formation thereof.

BACKGROUND

Memory is often implemented in electronic systems, such as computers, cell phones, hand-held devices, etc. There are many different types of memory, including volatile and non-volatile memory. Volatile memory may require power to maintain its data and may include random-access memory (RAM), dynamic random-access memory (DRAM), static random-access memory (SRAM), and synchronous dynamic random-access memory (SDRAM). Non-volatile memory may provide persistent data by retaining stored data when not powered and may include NAND flash memory, NOR flash memory, nitride read only memory (NROM), phase-change memory (e.g., phase-change random access memory), resistive memory (e.g., resistive random-access memory), cross-point memory, ferroelectric random-access memory (FeRAM), or the like.

In some examples, DRAM arrays can include respective groups of DRAM cells coupled to respective digit lines. A respective memory cell from each group can be commonly coupled to a respective access line, such as a word line. In some examples, a DRAM cell can include a storage device (e.g., storage element), such as a capacitor, coupled by an access device, such as an access transistor, to a digit line. The access device can be activated (e.g., to select the cell) by an access line coupled to the access transistor. The capacitor can store a charge corresponding to a data value of a respective cell (e.g., a logic "1" or "0").

DETAILED DESCRIPTION

Figure 1:
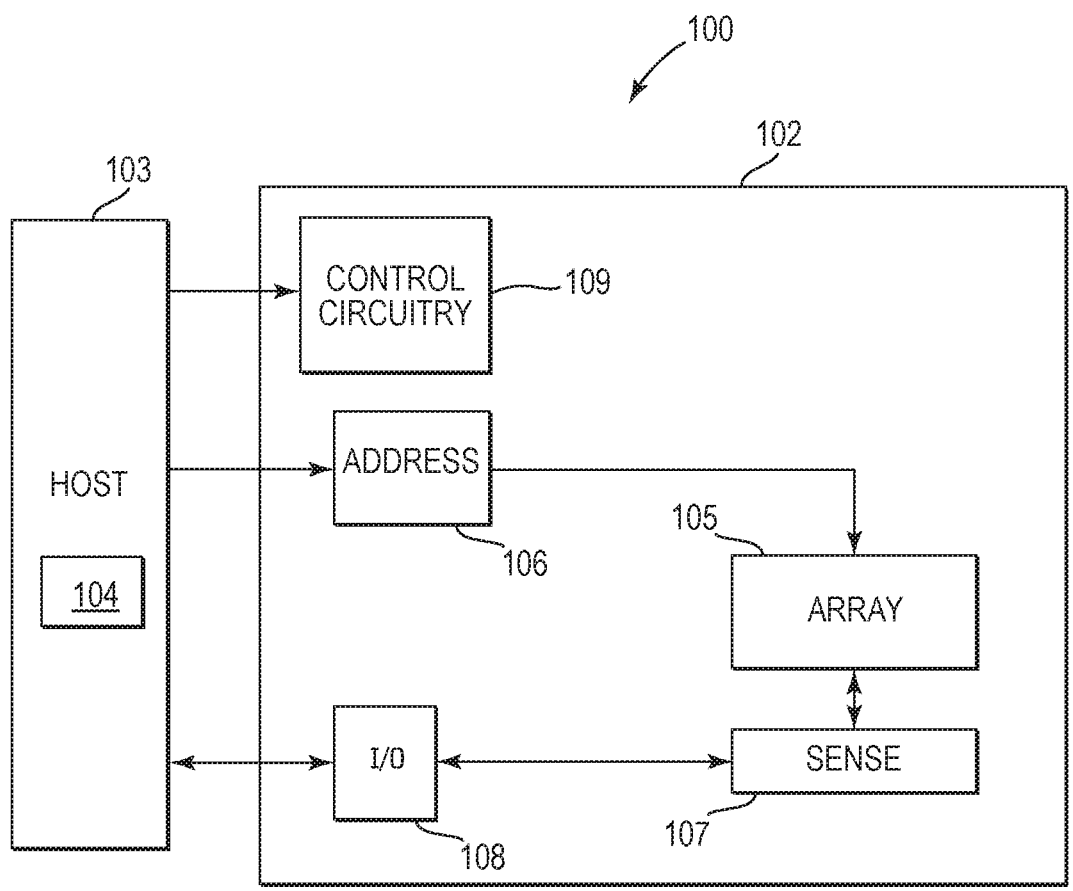
FIG. 1 is a block diagram of an apparatus in accordance a number of embodiments of the present disclosure.

As indicated previously, various memory arrays, such as DRAM arrays, can have groups of memory cells coupled to respective digit lines (e.g., local digit lines). In various instances, a region, such as a slit, (e.g., that can be referred to as a shunt region) can be between the respective groups of memory cells and between the respective local digit lines. The respective local digit lines can be selectively coupled (e.g., by respective transistors in the shunt region) to a digit line (e.g., hierarchical digit line) that can be coupled to a main sense amplifier. A memory cell of a respective group can be sensed by the main sense amplifier by activating the respective transistor to couple the respective local digit line to the hierarchical digit line.

Local digit lines selectively coupled to the hierarchical digit line can be referred to as a hierarchical scheme. Hierarchical schemes can be applied to achieve high-speed operation, for example.

The length of the hierarchical digit line can increase with the number of groups of memory cells and local digit lines. However, the signal in the hierarchical digit line that can weaken with distance along the hierarchical digit line. As such, a charge sharing device (e.g., a pull-down charge amplifier) can be positioned in the shunt region to amplify the signal in the hierarchical digit line and can allow for a longer hierarchical digit line, and thus more local digit lines and more groups of memory cells.

The size of the shunt region can determine the length of the hierarchical digit line. For example, a larger shunt region can result in a larger array area (e.g., array footprint) and in a longer hierarchical digit line for a given number of local digit lines and groups of memory cells. In the various embodiments disclosed herein the hierarchical digit line is placed above a storage node, e.g., capacitor, and may be as long as a timing margin allows. A shunt region is opened to add circuits to connect digit lines described herein.

In various embodiments, an apparatus, such as a memory array, can have a memory cell coupled to a first digit line (e.g., a local digit line) at a first level. A second digit line (e.g., hierarchical digit line) at a second level can be coupled to a main sense amplifier. A charge sharing device at a third level between the first and second levels can be coupled to the first digit line and to a connector. A vertical transistor at the third level can be coupled between the first digit line and the connector. A contact can be coupled between the connector and the second digit line. The vertical transistor can reduce the space requirements compared to previous approaches that may use planar transistors below the local digit lines to couple the local digit lines to the hierarchical digit line.

Coupling the charge sharing device and the vertical transistor to the connector and coupling the connector to the hierarchical digit line by the contact can act to reduce the size of the shunt area compared to instances in which the vertical transistor and the local transistor are coupled to the hierarchical digit line by separate contacts. Moreover, the connector can act as a landing pad for the contact that can be large enough to receive the contact because, for example, the contact might be too large to be coupled directly to the digit line without contacting and shorting to an adjacent digit line.

Various methods of forming vertical transistors, such as vertical thin film transistors (TFTs) between the local digit lines and the hierarchical digit line (e.g., in the shunt region), are disclosed to facilitate the integration of vertical TFTs in the shunt region. The vertical TFTs between the local digit lines and the hierarchical digit line can reduce the space requirements compared to previous approaches that may use planar transistors below the local digit lines to couple the local digit lines to the hierarchical digit line.

FIG. 1 is a block diagram of an apparatus in accordance a number of embodiments of the present disclosure. For example, the apparatus can be an electronic system, such as a computing system 100. Computing system 100 can include a memory device 102 coupled to a host 103. Host 103 can include a processing device 104 that can include a host processor. Host 103 can be, for example, a host system, such as a personal laptop computer, a desktop computer, a digital camera, a mobile device (e.g., cellular phone), network server, Internet of Things (IoT) enabled device, or a memory card reader, among various other types of hosts.

Memory device 102 can be a DRAM device, an FeRAM device, among other types of memory devices. Memory device 102 includes a memory array 105 of memory cells, such as DRAM cells, ferroelectric cells, among other types of memory cells. For example, memory array 105 can include the memory arrays disclosed herein. Memory device 102 includes address circuitry 106 coupled to array 105 and configured to receive address signals (e.g., addresses) from host 103 for addressing locations in array 105. In various embodiments, memory device 102 and/or memory array 105 can be separately referred to as apparatus.

Sense circuitry 107 can be used to read data from array 105 and couple output data to I/O circuitry 108. The I/O circuitry operates in a bi-directional manner to receive data from host 103 and pass this data to array 105. In some examples, sense circuitry 107 can include the main sense amplifiers discussed herein. Memory device 102 includes control circuitry 109 to manage data storage and retrieval from array 105 in response to instructions generated by host 103. In some examples, control circuitry 109 can include a state machine and/or a sequencer.

Figure 2A:
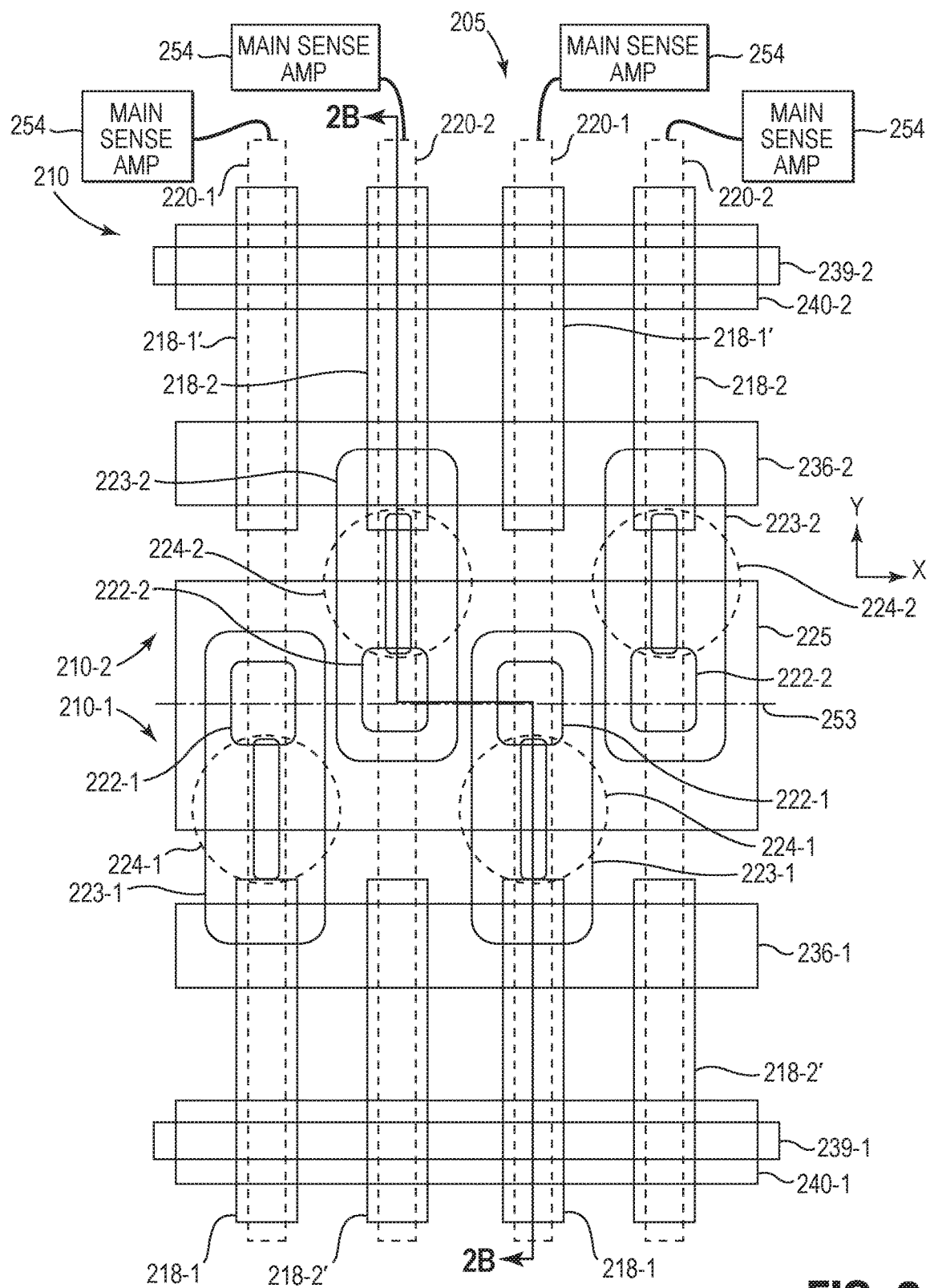
FIG. 2A is a top-down plan view of a region of a memory array that can be between memory cell regions of the memory array in accordance with a number of embodiments of the present disclosure.
Figure 2B:
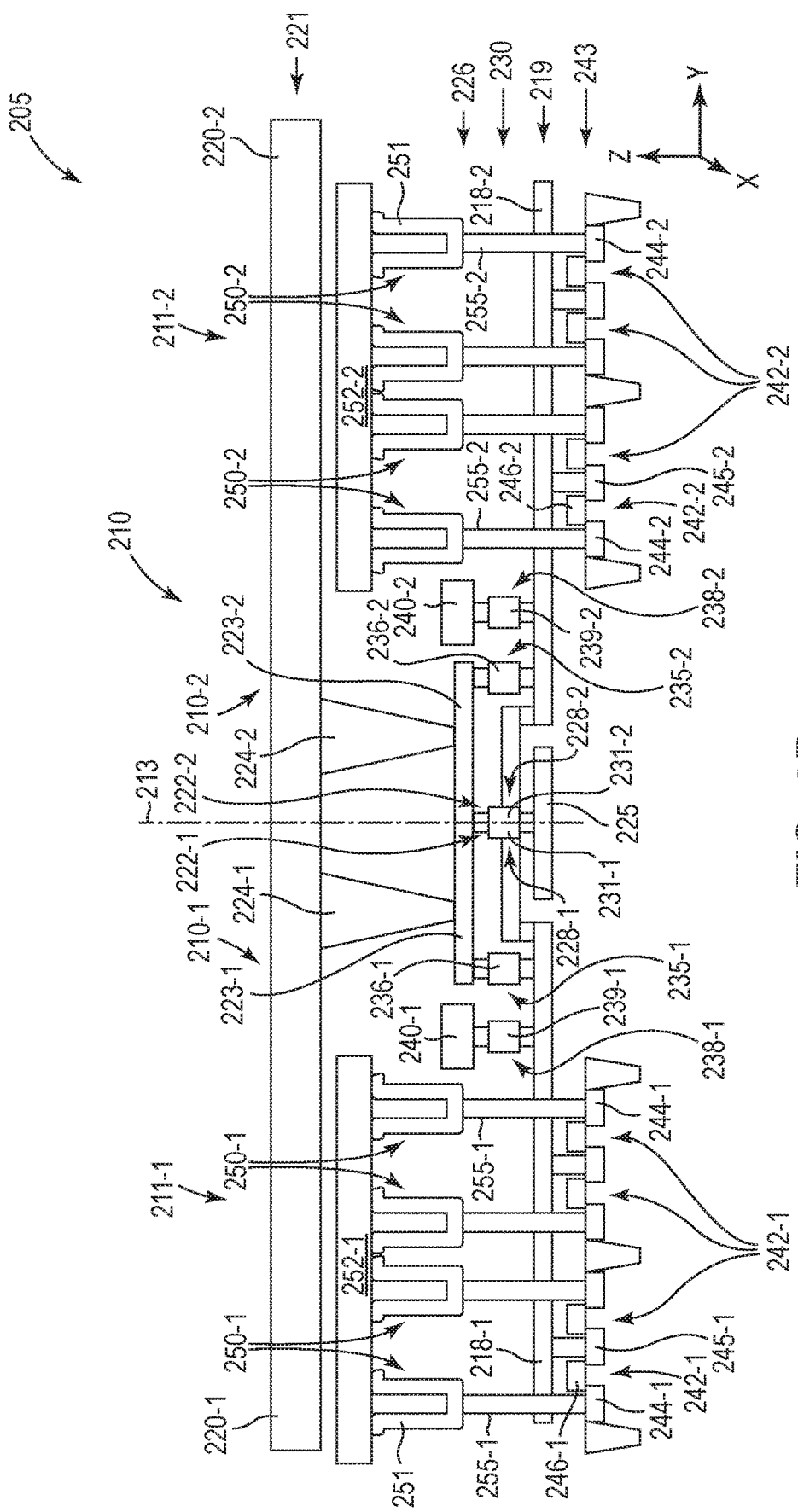
FIG. 2B is a cross-sectional view that includes a cross-section of the region in FIG. 2A viewed along line 2B-2B in FIG. 2A in accordance with a number of embodiments of the present disclosure.

FIG. 2A is a top-down plan view (e.g., through various x-y planes) of a region 210 of a memory array 205 that can be between memory cell regions of memory array 205 in accordance with a number of embodiments of the present disclosure. FIG. 2B is a cross-sectional view (e.g., in the y-z plane) of a portion of memory array 205, including a cross-sectional view of region 210 viewed along line 2B-2B in FIG. 2A, in accordance with a number of embodiments of the present disclosure. In various instances, region 210 can be referred to as a shunt region. Memory array 205 can be a portion of memory array 105 in various examples.

As shown in FIG. 2B, region 210 can be between memory cell regions 211-1 and 211-2. The cross-sections respectively to the left and to the right of axis 213 in FIG. 2B are respectively in different parallel y-z planes. For example, the cross-section at the left includes memory cell region 211-1 and a portion 210-1 of region 210, and the cross-section at the right includes memory cell region 211-2 and a portion 210-2 of region 210. As such, the portions 210-1 and 210-2 in FIG. 2B are respectively in different parallel y-z planes.

Note that the portions 210-1 and 210-2 of region 210 in FIG. 2A are respectively on opposite sides of (e.g., respectively above and below) an axis 253 that extends in the x-direction and that can be perpendicular to and intersected by axis 213. For example, axis 213 can be perpendicular to the face plane of FIG. 2A. Note that the portions of line 2B-2B in FIG. 2A, respectively corresponding to local digit lines 218-1 and 218-2, are respectively at different x-locations.

In FIG. 2B, the z-direction is perpendicular to the y-direction and the x-direction that is into and out of the page and perpendicular to the face plane of the page (e.g., y-z plane). The z-direction can be perpendicular to a base plane, such as a base structure (e.g., semiconductor), and can be the vertical direction. The term "perpendicular" as used herein takes into account variations from "exactly" perpendicular due to routine manufacturing and/or assembly variations and that one of ordinary skill in the art would know what is meant by the term "perpendicular." The term "parallel" as used herein takes into account variations from "exactly" parallel due to routine manufacturing and/or assembly variations and that one of ordinary skill in the art would know what is meant by the term "parallel."

Digit lines 218-1 and 218-2 can be formed at a level (e.g., a vertical level) 219. Digit line 218-1 can extend from memory cell region 211-1 into portion 210-1 of region 210, and digit line 218-2 can extend from memory cell region 211-2 into portion 210-2 of region 210. Digit lines 218-1 and 218-2 can be respectively selectively coupled to digit lines 220-1 and 220-2 (e.g., hierarchical digit lines) formed at a level 221 that can be vertically above level 219 (e.g., in the z-direction). A charge sharing device 222-1 in portion 210-1 can be coupled to digit line 218-1, and a charge sharing device 222-2 in portion 210-2 can be coupled to digit line 218-2. In various examples, a hierarchical digit line structure can refer to a structure that can include digit lines 218-1 and 220-1 and/or digit lines 218-2 and 220-2.

Charge sharing device 222-1 can be coupled between digit line 220-1 and a bus 225 via a conductor (e.g., conductive material), such as connector 223-1 (e.g., a conductive pad), and another conductor, such as a contact 224-1. Bus 225 can be formed at level 219 and can extend between digit lines 218-1 and 218-2 in the x-direction in region 210, as shown in FIG. 2A. Charge sharing device 222-1 can be coupled between bus 225 and connector 223-1, and contact 224-1 can be coupled between connector 223-1 and digit line 220-1. For example, contact 224-1 can be coupled in direct physical contact with connector 223-1 and digit line 220-1. Connector 223-1 can be at a level 226 that is between level 219 and level 221.

Charge sharing device 222-2 can be coupled between digit line 220-2 and bus 225 via a connector 223-2 and a contact 224-2. Charge sharing device 222-2 can be coupled between bus 225 and connector 223-2, and contact 224-2 can be coupled between connector 223-2 and digit line 220-2. For example, contact 224-2 can be coupled in direct physical contact with connector 223-2 and digit line 220-2. Connector 223-2 can be at level 226.

As used herein, the term "level" is used to refer to a generally planar region in the z-direction (e.g., in the vertical direction). Accordingly, elements formed at a particular level can refer to elements having at least a portion formed within a particular planar region in the vertical direction. Different levels can refer to planar regions that do not overlap (in the vertical direction). Accordingly, elements formed at different levels refer to elements that do not overlap in the vertical direction.

Charge sharing devices 222-1 and 222-2 can respectively include vertical TFTs 228-1 and 228-2 (e.g., that can be referred to as vertical sense amplifier TFTs) at a level 230 that can be between levels 219 and 226. Vertical TFT 228-1 is coupled between bus 225 and connector 223-1 in portion 210-1, and vertical TFT 228-2 is coupled between bus 225 and connector 223-2 in portion 210-2. Vertical TFT 228-1 is configured to selectively couple bus 225 to digit line 220-1 via connector 223-1 and contact 224-1, and vertical TFT 228-2 is configured to selectively couple bus 225 to digit line 220-2 via connector 223-2 and contact 224-2.

Vertical TFT 228-1 can include a gate, that can be a portion of a control line 231-1 in portion 210-1, at the level 230 between a source/drain coupled to bus 225 and source/drain coupled to connector 223-1. Vertical TFT 228-2 can include a gate, that can be a portion of a control line 231-2 in portion 210-2, at the level 230 between a source/drain coupled to bus 225 and source/drain coupled to connector 223-2. Control lines 231-1 and 232-2 can extend in the x-direction, for example. The gates of TFTs 228-1 and 228-2 can be respectively coupled to digit lines 218-1 and 218-2.

A vertical TFT 235-1 at level 230 can be coupled between digit line 218-1 and connector 223-1 in portion 210-1, and a vertical TFT 235-2 at level 230 can be coupled between digit line 218-2 and connector 223-2 in portion 210-2. Vertical TFT 235-1 can be configured to selectively couple digit line 218-1 to digit line 220-1 via connector 223-1 and contact 224-1. For example, vertical TFT 235-1 can be configured to selectively couple digit line 218-1 to connector 223-1. As such, digit line 218-1 can be selectively coupled to connector 223-1. Vertical TFT 235-2 can be configured to selectively couple digit line 218-2 to digit line 220-2 via connector 223-2 and contact 224-2. For example, vertical TFT 235-2 can be configured to selectively couple digit line 218-2 to connector 223-2. As such, digit line 218-2 can be selectively coupled to connector 223-2.

Vertical TFT 235-1 can include a gate, that can be a portion of a control line 236-1 in portion 210-1, at the level 230 between a source/drain coupled to connector 223-1 and a source/drain coupled to digit line 218-1. Vertical TFT 235-2 can include a gate, that can be a portion of a control line 236-2 in portion 210-2, at the level 230 between a source/drain coupled to connector 223-2 and a source/drain coupled to digit line 218-2. Control lines 236-1 and 236-2 can extend in the x-direction, as shown in FIG. 2A. In some examples, TFTs 235 can have a lower threshold voltage than TFTs 228. Vertical TFTs 235 can be referred to as vertical multiplexing TFTs, for example.

A vertical TFT 238-1 at level 230 can be coupled between a bus 240-1 and digit line 218-1 in portion 210-1, and a vertical TFT 238-2 at level 230 can be coupled between a bus 240-2 and digit line 218-2 in portion 210-2. For example, vertical TFT 238-1 can be configured to selectively couple bus 240-1 to digit line 218-1, and vertical TFT 238-2 can be configured to selectively couple bus 240-2 to digit line 218-2. Buses 240-1 and 240-2 can be at level 226 and can extend in the x-direction, as shown in FIG. 2A. In various examples, buses 240-1 and 240-2 can be coupled to ground.

Vertical TFTs 238-1 and 238-2 can be referred to as vertical pre-charge TFTs, in that vertical TFTs 238-1 and 238-2 can respectively selectively couple digit lines 218-1 and 218-2 to buses 240-1 and 240-2 to pre-charge digit lines 218-1 and 218-2 (e.g., to ground). Vertical TFT 238-1 can include a gate, that can be a portion of a control line 239-1 in portion 210-1, at the level 230 between a source/drain coupled to bus 240-1 and a source/drain coupled to a digit line 218-1. Vertical TFT 238-2 can include a gate, that can be a portion of a control line 239-2 in portion 210-2, at the level 230 between a source/drain coupled to bus 240-2 and a source/drain coupled to a digit line 218-2. Control lines 239-1 and 239-2 can extend in the x-direction, as shown in FIG. 2A. In some examples, TFTs 228 can have a lower threshold voltage than vertical TFTs 238.

Respective memory cells of a group of memory cells in memory cell region 211-1 can be coupled to digit line 218-1. Each respective memory cell in memory cell region 211-1 can include a storage element, such as a capacitor 250-1, coupled to an access transistor 242-1 that is coupled to digit line 218-1. For example, a respective access transistor 242-1 of a respective memory cell can be configured to selectively couple the respective capacitor 250-1 of the respective memory cell to digit line 218-1.

Respective memory cells of a group of memory cells in memory cell region 211-2 can be coupled to digit line 218-2. Each respective memory cell in memory cell region 211-2 can include a storage element, such as a capacitor 250-2, coupled to an access transistor 242-2 that is coupled to digit line 218-2. For example, a respective access transistor 242-2 of a respective memory cell can be configured to selectively couple the respective capacitor 250-2 of the respective memory cell to digit line 218-2.

Access transistors 242-1 and 242-2 can be at a level 243 that can be below level 219 such that level 219 is between levels 243 and 230. In some examples, each access transistor 242-1 can include a gate between source/drain regions 244-1 and 245-1, and each access transistor 242-2 can include a gate between source/drain regions 244-2 and 245-2. For example, a gate between source/drain regions 244-1 and 245-1 can be a portion of an access line 246-1 in memory cell region 211-1, and a gate between source/drain regions 244-2 and 245-2 can be a portion of an access line 246-2 in memory cell region 211-2. In various instances, access transistors can be referred to as buried recess access devices (BRADs).

Access lines 246-1 and 246-2, source/drain regions 244-1 and 245-1, and source/drain regions 244-2 and 245-2 can extend in the x-direction. In some examples, access transistors 244 can be referred to as horizontal planar transistors, in that source/drains 244 and 245 can be oriented horizontally in a common plane at a common level. The vertical TFTs disclosed herein can have relaxed leakage requirements compared to access transistors 244, for example.

Each respective source/drain region 244-1 can be coupled to a respective capacitor 250-1 by a respective contact 255-1 in memory cell region 211-1, and each respective source/drain region 244-2 can be coupled to a respective capacitor 250-2 by a respective contact 255-2 in memory cell region 211-2. Each of the capacitors 250-1 and 250-2 can include a capacitor plate 251 that can be shaped like a container (e.g., that can contain a ferroelectric material). The capacitor plates 251 of capacitors 250-1 can be selectively coupled to digit line 218-1 by access transistors 242-1 and can be capacitively coupled to a common plate 252-1 in memory cell region 211-1. The capacitor plates 251 of capacitors 250-2 can be selectively coupled to digit line 218-2 by access transistors 242-2 and can be capacitively coupled to a common plate 252-2 in memory cell region 211-2. Plates 252-1 and 252-2 can extend in the x-direction along the length of access lines 246-1 and 246-2. Different voltage potentials can be applied to plates 252-1 and 252-2 to store (e.g., program) different data values in capacitors 250-1 and 250-2.

As shown in FIG. 2A, there are a number of alternating digit lines 220-1 and 220-2, a number of alternating digit lines 218-1 and 218-2, a number of alternating connectors 223-1 and 223-2, and a number of alternating contacts 224-1 and 224-2. For example, digit lines 220-1 and 220-2, digit lines 218-1 and 218-2, connectors 223-1 and 223-2, and contacts 224-1 and 224-2 alternate in the x-direction.

A number of alternating charge sharing devices 222-1 and 222-2 are aligned on the axis 253 and are coupled to bus 225, as discussed previously in conjunction with FIG. 2B. For example, each respective charge sharing device 222-1 can have a respective vertical TFT 228-1 coupled between a respective connector 223-1 and bus 225, and each respective charge sharing device 222-2 can have a respective vertical TFT 228-2 coupled between a respective connector 223-2 and bus 225, as discussed previously in conjunction with FIG. 2B. In various examples, charge sharing devices 222-1 and 222-2 are aligned on (e.g., along) axis 253 and alternate in the x-direction. Axis 253 can be referred to as a common axis, for example, because axis 253 can be common to charge sharing devices 222-1 and 222-2.

Digit lines 218-1 and digit lines 218-2 respectively extend in opposite directions (e.g., opposite y-directions) from axis 253. Connectors 223-1 and connectors 223-2 respectively extend in opposite directions (e.g., opposite y-directions) from axis 253. For example, respective connectors 223-1 extend from respective charge sharing devices 222-1 toward respective digit lines 218-1, and respective connectors 223-2 extend from local respective sense amplifiers 222-2 toward respective digit lines 218-2. Each of digit lines 220-1 and 220-2 can be coupled to a respective main sense amplifier 254. Each main sense amplifier 254 can be coupled to an input/output, such as I/O 108 in FIG. 1.

Each respective connector 223-1 is coupled to a respective sense amplifier 222-1 and is selectively coupled to a respective digit line 218-1 by a respective vertical TFT 235-1, and each respective connector 223-2 is coupled to a respective sense amplifier 222-2 and is selectively coupled to a respective digit line 218-2 by a respective vertical TFT 235-2, as discussed previously in conjunction with FIG. 2B.

Each respective contact 224-1 is coupled between a respective connector 223-1 and a respective digit line 220-1, and each respective contact 224-2 is coupled between a respective connector 223-2 and a respective digit line 220-2, as discussed previously in conjunction with FIG. 2B. A connector 223 can act as landing pad for a contact 224 that can be large enough to receive contact 224 because, in some instances, the contact 224 can be too large to be coupled directly to a digit line 218 without contacting and shorting to an adjacent digit line 218.

Contacts 224-1 and 224-2 are staggered about axis 253 such that contacts 224-1 and 224-2 are respectively on opposite sides of axis 253. For example, contacts 224-1 can be aligned parallel to axis 253 in region 210-1 and contacts 224-2 can be aligned parallel to axis 253 in region 210-2. Staggering the contacts 224-1 and 224-2 can allow contacts 224-1 and 224-2 to fit in region 210 without, for example, increasing the size of region 210.

In various examples, digit lines 218-1' can be respectively on pitch (e.g., respectively aligned in the x-direction) with digit lines 218-1, and digit lines 218-2' can be respectively on pitch (e.g., respectively aligned in the x-direction) with digit lines 218-2. For example, digit lines 218-1' can respectively extend (e.g., in the positive y-direction) to another region 210 and be respectively selectively coupled to digit lines 220-1 that region 210, and digit lines 218-2' can respectively extend (e.g., in the negative y-direction) to another region 210 and be respectively selectively coupled to digit lines 220-2 that region 210.

Figure 3:
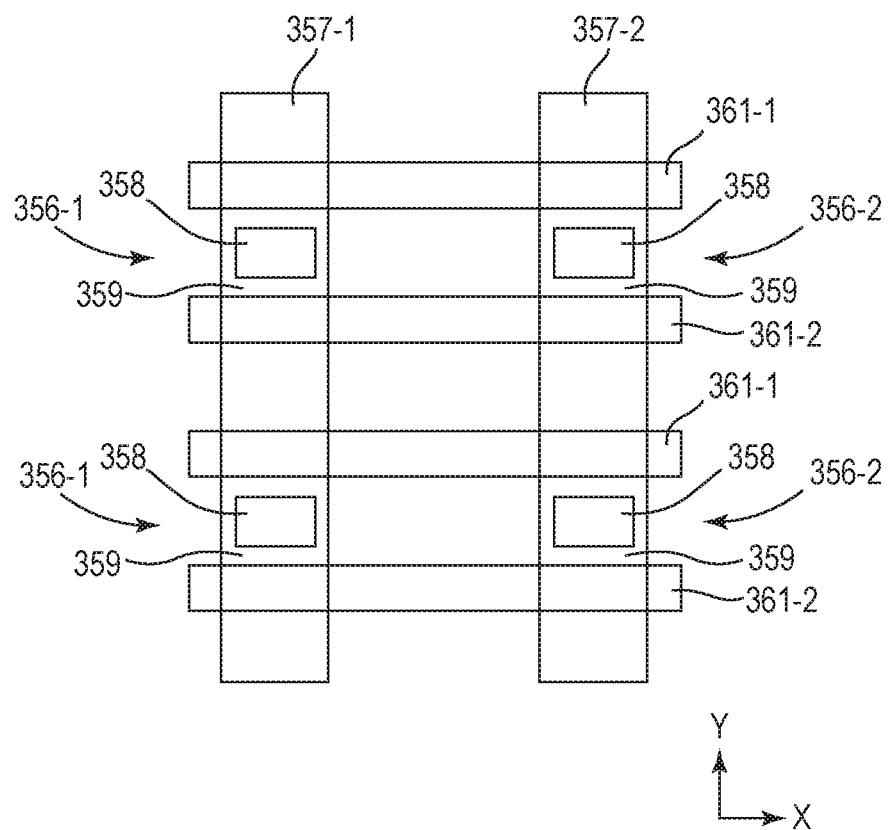
FIG. 3 is a top-down plan view illustrating a layout of various vertical transistors in accordance with a number of embodiments of the present disclosure.

FIG. 3 is a top-down plan view (e.g., through various x-y planes) illustrating a layout of various vertical TFTs 356, such as vertical TFTs 356-1 and 356-2, in accordance with a number of embodiments of the present disclosure. For example, a vertical TFT 356 can be a vertical TFT 235-1 or 235-2 (e.g., a multiplexing TFT) or a vertical TFT 238-1 or 238-2 (e.g., a pre-charge TFT) in FIG. 2. Vertical TFTs 356-1 can be commonly coupled to a conductor 357-1, and vertical TFTs 356-2 can be commonly coupled to a conductor 357-2. Conductors 357 can be digit lines 218, for example.

Each vertical TFT 356 can include a semiconductor structure, such as a semiconductor pillar 358. For example, semiconductor pillars 358 can be polycrystalline semiconductor pillars, such as polysilicon pillars. Each vertical TFT 356 can include a dielectric 359 (e.g., a dielectric material), such as oxide, adjacent to the semiconductor pillar 358. For example, dielectric 359 can wrap completely around the semiconductor pillar 358.

Conductors 361-1 and 361-2 (e.g., titanium nitride, titanium, tungsten, among other metals or metal containing materials) can be on opposite sides of semiconductor pillars 358 adjacent to portions of dielectrics 359. As described further herein, in conjunction with FIGS. 6C to 6I, conductors 361 can be formed in continuous openings (e.g., trenches) extending in the x-direction on either side of the semiconductor pillars 358. For example, a semiconductor pillar 358 can be formed between a pair of parallel planar trenches extending in the x-direction and a pair of parallel planar trenches extending in the y-direction that intersect the pair of parallel planar trenches extending in the x-direction.

A portion of a dielectric 359 can be between a conductor 361-1 and semiconductor pillar 358, and a portion of a dielectric 359 can be between a conductor 361-2 and semiconductor pillar 358. Conductors 361-1 and 361-2 can be a gate of a transistor 356-1 and a gate of a transistor 356-2. For example, a transistor 356-1 and a transistor 356-2 can have a common gate, extending in the x-direction, that includes conductors 361-1 and 361-2. The common gate can be referred to as a planar gate, for example, because the common gate does not wrap (e.g., completely) around the semiconductor pillars 358. In various examples, the common gate can be a control line 236-1, 236-2, 239-1, or 239-2.

The portions of the dielectric 359 that are between a conductor 361-1 and a semiconductor pillar 358 and between a conductor 361-2 and a semiconductor pillar 358 can be a gate dielectric of a vertical TFT 356-1 and a vertical TFT 356-2. In some examples, dielectric 359 might only be between conductors 361-1 and 361-2 and semiconductor pillars 358 and not wrap completely around semiconductor pillars 358. In various examples, a channel can form in a semiconductor pillar 358 in response to activation of the respective vertical TFT 356. As such, a semiconductor pillar 358 can be referred to as a channel region of the respective vertical TFT 356.

Figure 4:
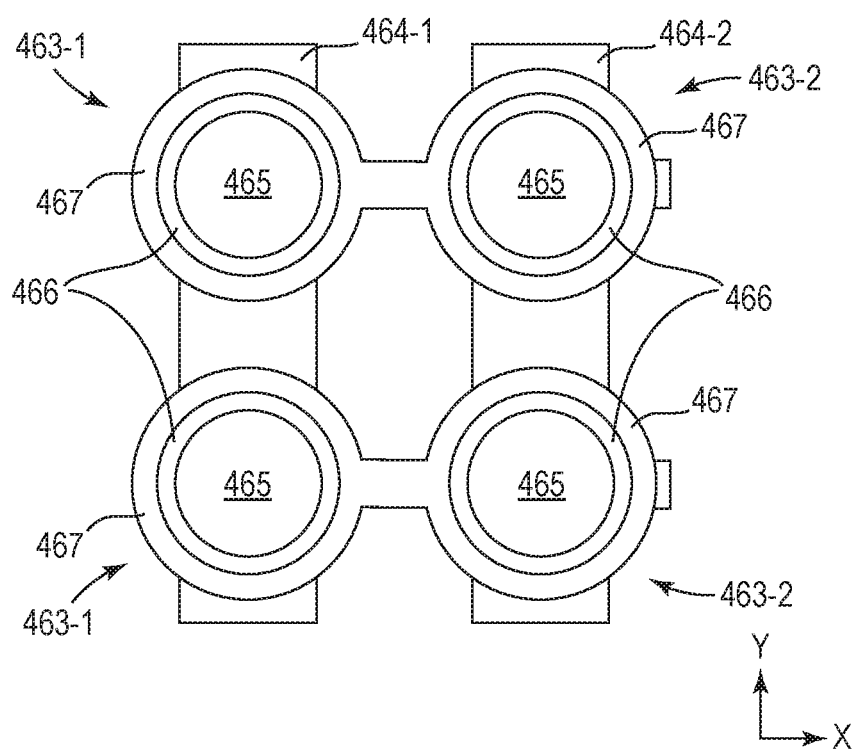
FIG. 4 is a top-down plan view illustrating a layout of various vertical transistors in accordance with a number of embodiments of the present disclosure.

FIG. 4 is a top-down plan view (e.g., through various x-y planes) illustrating a layout of various vertical TFTs 463, such as vertical TFTs 463-1 and 463-2, in accordance with a number of embodiments of the present disclosure. For example, a vertical TFT 463 can be a vertical TFT 228-1 or 228-2 (e.g., a pull down amplifier TFT or charge sharing device), a vertical TFT 235-1 or 235-2 (e.g., a multiplexing TFT) or a vertical TFT 238-1 or 238-2 (e.g., a pre-charge TFT) in FIG. 2.

Vertical TFTs 463-1 can be commonly coupled to a conductor 464-1, and vertical TFTs 463-2 can be commonly coupled to a conductor 464-2. Conductors 464 can be digit lines 218 or bus 225, for example.

Each vertical TFT 463 can include a semiconductor structure, such as a semiconductor pillar 465, that can be polysilicon, for example. Each vertical TFT 463 can include a gate dielectric 466 (e.g., a gate oxide) adjacent to the semiconductor pillar 465. For example, gate dielectric 466 can wrap completely around the semiconductor pillar 465. As described further herein, in conjunction with FIGS. 7A to 7N, gate dielectrics 466 can be formed in discrete openings (e.g., discrete circular, oval, or elliptical openings or the like) to line the openings and semiconductor pillars 465 can be formed in the openings adjacent to gate dielectrics 466.

Vertical TFTs 463-1 and 463-2 can have a common gate 467 that extends in the x-direction and that can wrap completely around the gate dielectrics 466. For example, a gate 467 of a vertical TFT 463 can wrap completely around the gate dielectrics 466, and thus completely around the semiconductor pillar 465. In various examples, the common gate 467 can be a control line 231-1, 231-2, 236-1, 236-2, 239-1, or 239-2.

In some examples, each of vertical TFTs 228-1 and 228-2 (e.g., sense amplifier TFTs), each of vertical TFTs 235-1 and 235-2 (e.g., multiplexing TFTs), and each of vertical TFTs 238-1 and 238-2 (e.g., pre-charge TFTs) in FIG. 2 can be a vertical TFT 465 having a semiconductor pillar 465, a gate dielectric 466 that can wrap completely around semiconductor pillar 465, and a gate 467 that can wrap completely around gate dielectric 466, and thus completely around semiconductor pillar 465.

In various other examples, each of vertical TFTs 228-1 and 228-2 can be a vertical TFT 465 and each of vertical TFTs 235-1 and 235-2 and/or each of vertical TFTs 238-1 and 238-2 can be a vertical TFT 356 in FIG. 3 having a semiconductor pillar 358, a gate dielectric 359, and a planar gate with conductors 361-1 and 316-2 on opposite sides of semiconductor pillar 358 adjacent to gate dielectric 359 such that the planar gate does not wrap completely around semiconductor pillar 358.

In some instances, each of vertical TFTs 238-1 and 238-2 can be a vertical TFT 356 while each of vertical TFTs 228-1 and 228-2 and each of vertical TFTs 235-1 and 235-2 can be a vertical TFT 465. In various other instances, each of vertical TFTs 235-1 and 235-2 can be a vertical TFT 356 while each of vertical TFTs 228-1 and 228-2 and each of vertical TFTs 238-1 and 238-2 can be a vertical TFT 465.

Vertical TFTs 463-1 can be commonly coupled to a conductor 464-1, and vertical TFTs 463-2 can be commonly coupled to a conductor 464-2. Conductors 464 can be digit lines 218 or bus 225, for example.

Figure 5A:
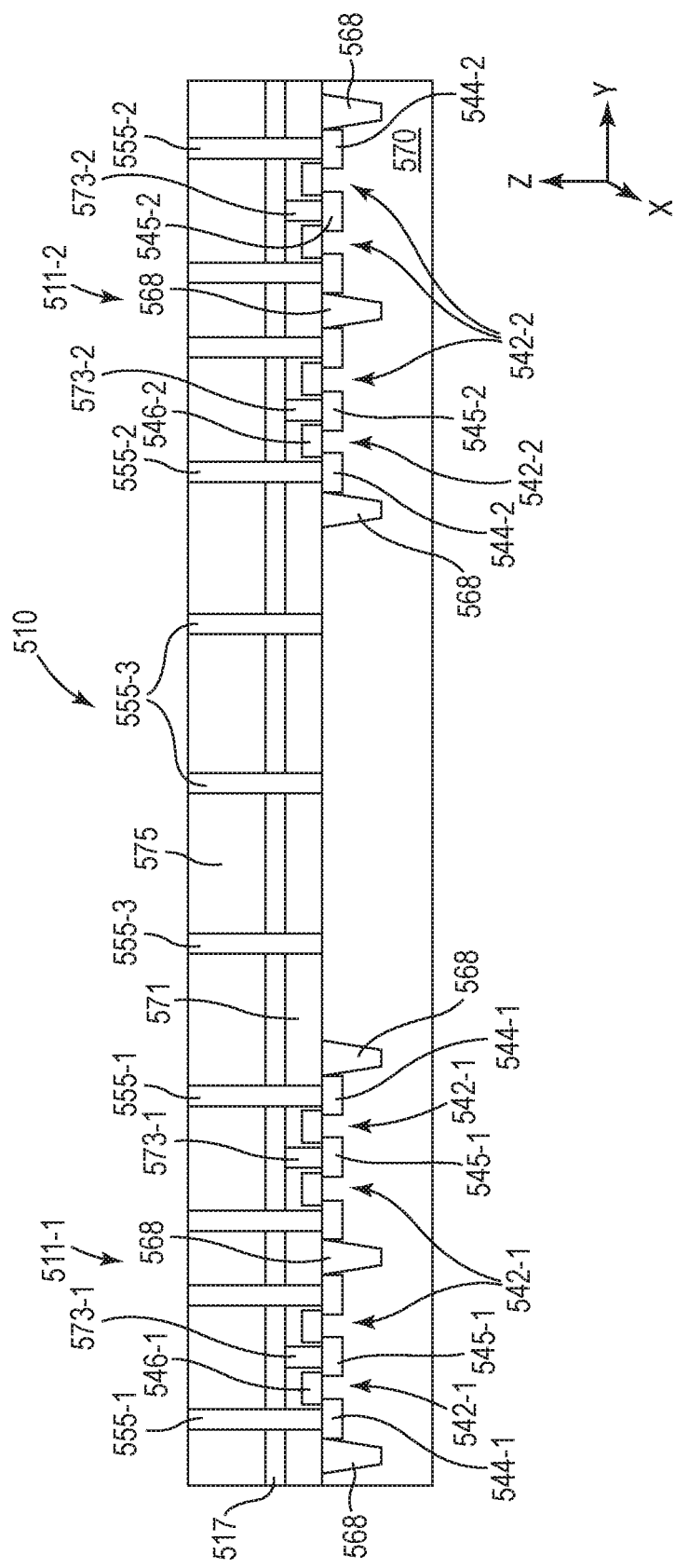
FIGS. 5A and 5B are cross-sectional views corresponding to particular stages of processing associated with forming a memory array in accordance with a number of embodiments of the present disclosure.
Figure 5B:
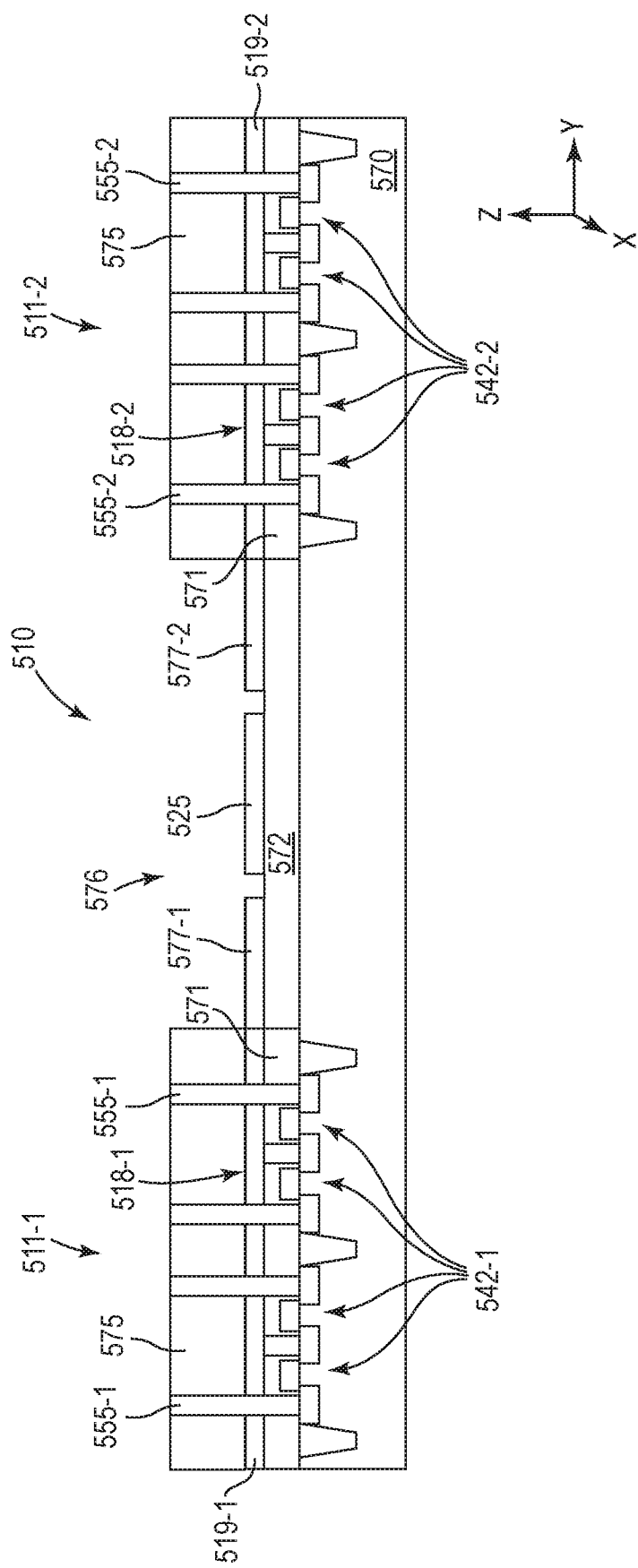

FIGS. 5A and 5B are cross-sectional views corresponding to particular stages of processing associated with forming a memory array, such as memory array 205, in accordance with a number of embodiments of the present disclosure. In some examples, a processing stage can include a number of steps that can have a number of sub-steps. FIG. 5A can correspond to a processing stage that can occur after a number of processing stages have occurred.

In FIG. 5A, isolation regions 568, such as shallow trench isolation regions (STIs), can be formed in a semiconductor 570, such as a monocrystalline semiconductor (e.g., monocrystalline silicon). Horizontal planar access transistors 542-1, that can be access transistors 242-1 in FIG. 2B, can be formed in and/or on semiconductor 570 between isolation regions 568 in a memory cell region 511-1 that can correspond memory cell region 211-1. Horizontal planar access transistors 542-2, that can be access transistors 242-2 in FIG. 2B, can be formed in and/or on semiconductor 570 between isolation regions 568 in a memory cell region 511-2 that can correspond memory cell region 211-2.

Each access transistor 542-1 can include a gate 546-1 formed on semiconductor 570 between source/drain regions 544-1 and 545-1 formed in semiconductor 570, and each access transistor 542-2 can include a gate 546-2 formed on semiconductor 570 between source/drain regions 544-2 and 545-2 formed in semiconductor 570. In various examples, the semiconductor 570 in region 510, between memory cell regions 511-1 and 511-2 and that can correspond to region 210 in FIG. 2B, can be protected (e.g., covered) by a mask while access transistors 542-1 and 542-2 are respectively formed in memory cell regions 511-1 and 511-2 so that no access transistors 542 are formed in and/or on semiconductor 570 in region 510. Note that, region 510 can be a shunt region, such as region 210.

A dielectric 571 (e.g., oxide) can be subsequently formed adjacent to (e.g., over and in direct physical contact with) semiconductor 570 in region 510, adjacent to semiconductor 570 and access transistors 542-1 in memory cell region 511-1, and adjacent to semiconductor 570 and access transistors 542-2 in memory cell region 511-2. Contacts 573-1 can be formed through dielectric 571 in memory cell region 511-1, stopping at or in source/drains 545-1, and contacts 573-2 can be formed through dielectric 571 in memory cell region 511-2, stopping at or in source/drains 545-2.

A conductor 517 (e.g., tungsten, titanium, among other metals) can be formed adjacent to dielectric 571 in memory cell regions 511-1 and 511-2 and in region 510. Conductor 517 can contact contacts 573-1 in memory cell region 511-1 and contacts 573-2 in memory cell region 511-2. A dielectric 575 (e.g., nitride) can be formed adjacent to conductor 517 in memory cell regions 511-1 and 511-2 and in region 510.

Contacts 555-1, that can be contacts 255-1 in FIG. 2B, can be formed through dielectrics 571 and 575 and conductor 517 in memory cell region 511-1, stopping on or in source/drains 544-1. Contacts 555-2, that can be contacts 255-2 in FIG. 2B, can be formed through dielectrics 571 and 575 and conductor 517 in memory cell region 511-2, concurrently with forming contacts 555-1, stopping on or in source/drains 544-2. Contacts 555-3 can be formed through dielectrics 571 and 575 and conductor 517 in region 510, concurrently with forming contacts 555-1 and 555-2, stopping on or in semiconductor 570. In various examples, contacts 555-1, 555-2, and 555-3 can be electrically isolated (e.g., by a dielectric) from conductor 517.

FIG. 5B is corresponds to a stage of processing following the stage of processing of FIG. 5A in accordance with a number of embodiments of the present disclosure. In FIG. 5B, dielectrics 571 and 575, conductor 517, and contacts 553-3 are removed from region 510 to form an opening 576 that exposes semiconductor 570 in region 510. Dielectrics 571 and 575, contacts 555-1, a portion 519-1 of conductor 517, and access transistors 542-1 Can be left in memory cell region 511-1. Dielectrics 571 and 575, contacts 555-2, a portion 519-2 of conductor 517, and access transistors 542-2 can be left in memory cell region 511-2.

A dielectric 572, such as oxide, can be formed adjacent to semiconductor 570 in region 510 and contiguous to (e.g., in contact with) dielectrics 571 in memory cell regions 511-1 and 511-2 to form a continuous dielectric structure. A conductor 577-1 (e.g., tungsten, titanium, among other metals) can be formed adjacent to dielectric 572 in region 510 and contiguous to (e.g., in direct physical contact with) portion 519-1 such that portion 519-1 and conductor 577-1 form a continuous digit line 518-1 that can be a digit line 218-1 in FIGS. 2A and 2B. A conductor 577-2 (e.g., tungsten, titanium, among other metals) can be formed adjacent to dielectric 572 in region 510 and contiguous to (e.g., in direct physical contact with) portion 519-2 such that portion 519-2 and conductor 577-2 form a continuous digit line 518-2 that can be a digit line 218-2 in FIGS. 2A and 2B. A bus 525 (e.g., tungsten, titanium, among other metals, that can be bus 225 in FIGS. 2A and 2B, can be formed adjacent to dielectric 572 in region 510 between digit lines 518-1 and 518-2. Conductors 577 and bus 525 can be formed concurrently, for example.

Subsequently, various vertical TFTs, such as vertical TFTs 228-1, 228-2, 235-1, 235-2, 238-1, and 238-2 in FIG. 2B, can be formed in opening 576, as disclosed herein in conjunction with FIGS. 6A to 6I and FIGS. 7A to 7N. For example, various vertical TFTs can be formed concurrently with forming circuitry in the periphery adjacent to the memory array.

After forming the various vertical TFTs in region 510, capacitors, such as capacitors 250-1 in FIG. 2B, including plates 251 and plate 252-1, can be formed in memory cell region 511-1 in contact with contacts 555-1, and capacitors, such as capacitors 250-2 in FIG. 2B, including plates 251 and plate 252-2, can be formed in memory cell region 511-2 in contact with contacts 555-2. After forming the various vertical TFTs in region 510 buses, such as buses 240-1 and 240-2, connectors, such as connectors 223-1 and 223-2, and contacts, such as contacts 244-1 and 244-2, can be formed in region 510. Digit lines, such digit lines 220-1 and 220-2, can then be formed.

FIGS. 6A to 6I are cross-sectional views corresponding to particular stages of processing associated with forming vertical TFTs in accordance with a number of embodiments of the present disclosure. For example, the vertical TFTs can be formed in region 510 in FIG. 5B. FIGS. 6A to 6I illustrate, for example, how vertical TFTs can be integrated in a shunt region, such as region 210. In some examples the vertical TFTs formed in FIGS. 6A to 6J can be vertical TFTs 356 in FIG. 3.

Figure 6A:
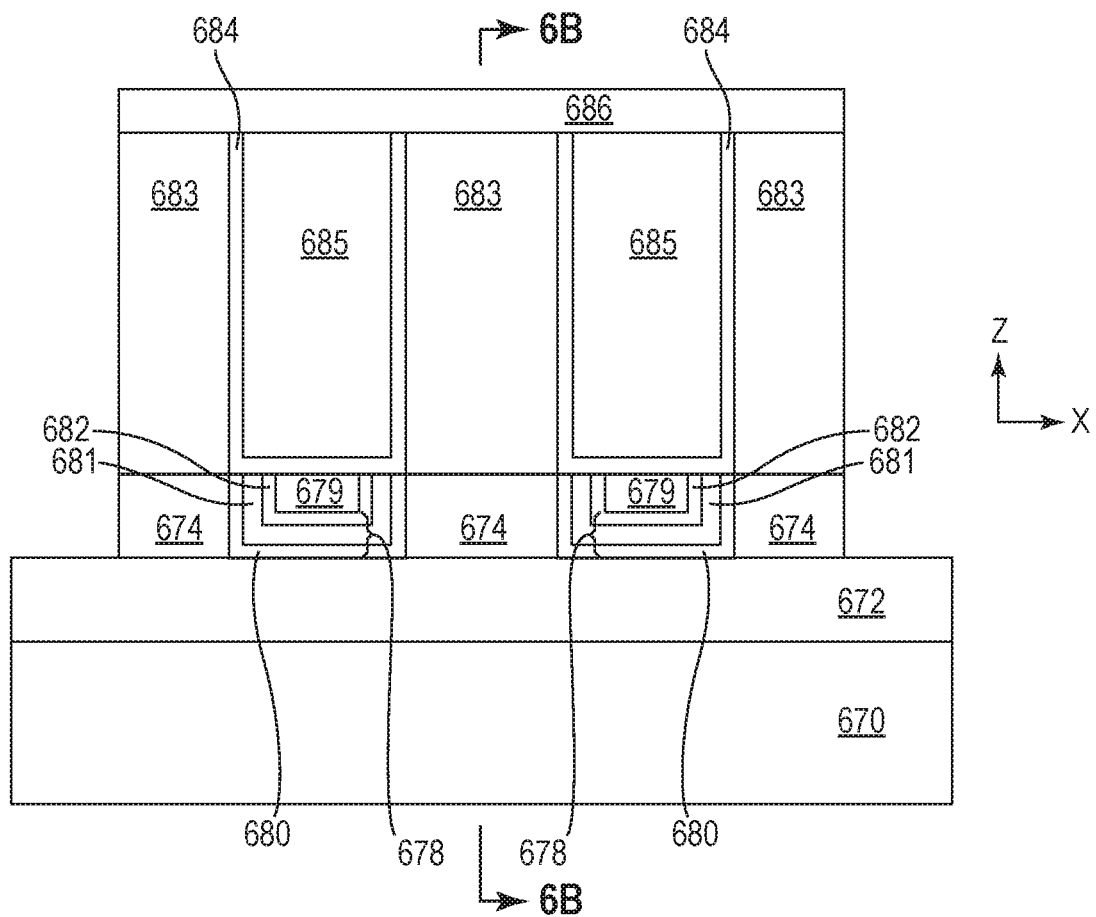
FIGS. 6A to 6I are cross-sectional views corresponding to particular stages of processing associated with forming vertical transistors in accordance with a number of embodiments of the present disclosure.
Figure 6B:
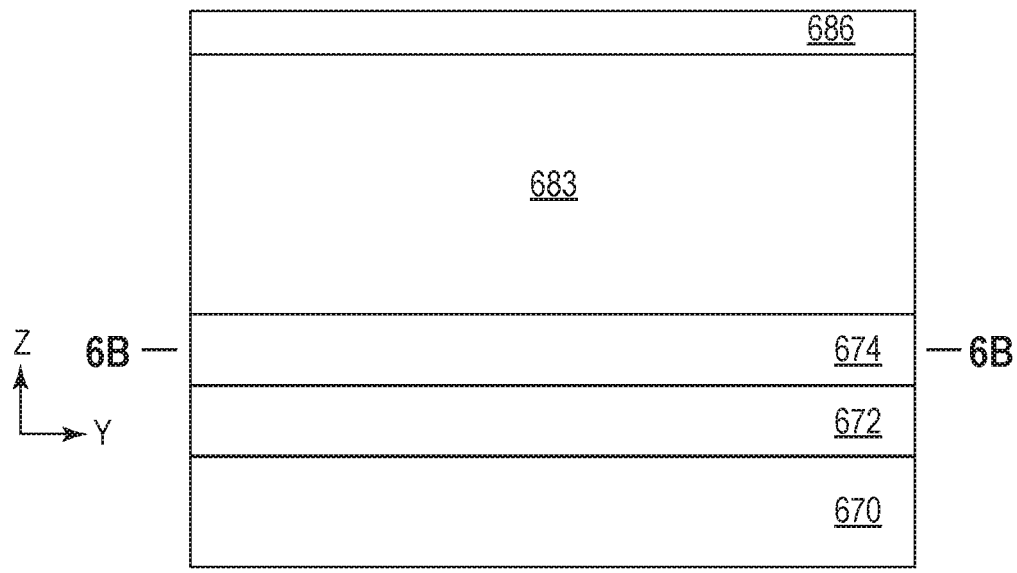

FIG. 6A is a cross-section (e.g., in the x-z plane) corresponding to a processing stage that can occur after a number of processing stages have occurred in accordance with a number of embodiments of the present disclosure. For example, FIG. 6A can correspond to region 510 in FIG. 5B and can be perpendicular to the plane of FIG. 5B. FIG. 6B is a cross-section (e.g., in the y-z plane) viewed along line 6B-6B in FIG. 6A and corresponds to the stage of processing in FIG. 6A in accordance with a number of embodiments of the present disclosure. For example, the structures in FIGS. 6A and 6B can be formed concurrently.

In FIGS. 6A and 6B a dielectric 672 (e.g., oxide), that can be dielectric 572, can be formed adjacent to a semiconductor 670, such as a monocrystalline semiconductor (e.g., monocrystalline silicon), that can be semiconductor 570. A conductor 674, such as metal (e.g., tungsten, titanium, among other metals), can be formed adjacent to dielectric 672. In various examples, conductor 577-1, and thus a digit line 518-1, or conductor 577-2, and thus a digit line 518-1, in FIG. 5B can correspond to conductor 674.

Openings (e.g., trenches) can then be formed in conductor 674. The openings can extend in the y-direction (e.g., perpendicular to the face plane of FIG. 6A). A dielectric liner 678 can be formed in the openings adjacent to remaining conductors 674, as shown in FIG. 6A, to line the openings. A dielectric 679, such as a spin-on dielectric, (e.g., oxide) can be formed in the opening adjacent to dielectric liner 678 (e.g., to fill the remainder of the opening) and, for example, densified. In some instances, portions of dielectric liner 678 and dielectric 679 that can extend over an uppermost surface of conductor 674 can be removed by chemical-mechanical planarization (CMP) such that uppermost surfaces (e.g., the tops) of dielectric liners 678, uppermost surfaces of dielectrics 679, and uppermost surfaces of conductors 674 are coplanar.

Note that the structures that include dielectric liners 678 and dielectrics 679 can be referred to as isolation regions (e.g., isolations) that can electrically isolate conductors 674 from each other. Respective conductors 674 in FIG. 6A can be respective digit lines.

In various examples, dielectric liner 678 can include a dielectric 680, such as oxide, adjacent to conductor 674, a dielectric 681, such as nitride, adjacent to dielectric 680, and a dielectric 682, such as oxide, adjacent to dielectric 681. For example, dielectric liner 678 can be an oxide-nitride-oxide (ONO) liner. Note, for example, that dielectric 679 can be adjacent to dielectric 682.

As shown in FIGS. 6A and 6B, a semiconductor 683, such as a polycrystalline semiconductor (e.g., polysilicon), can be formed adjacent to conductors 674 and adjacent to the isolations, including dielectric liner 678 and dielectric 679. In various instances, an interface metallic (e.g., that can be titanium nitride) can be formed adjacent to conductors 674, and semiconductor 683 can be formed adjacent to the interface metallic such that the interface metallic is between conductors 674 and semiconductor 683. Openings (e.g., trenches) can be formed in semiconductor 683. The openings can extend in the y-direction (e.g., perpendicular to the face plane of FIG. 6A). A dielectric liner 684 (e.g., oxide) can be formed in the openings adjacent to remaining semiconductors 683, as shown in FIG. 6A, to line the openings.

A dielectric 685, such as a spin-on dielectric, (e.g., oxide) can be formed in the openings adjacent to dielectric liners 684 and, for example, densified. In some instances, portions of dielectric liner 684 and dielectric 685 that can extend over uppermost surfaces (e.g., the tops) of semiconductors 683 can be removed by chemical-mechanical planarization (CMP) such that uppermost surfaces of dielectrics 685, uppermost ends of dielectric liners 684, and the uppermost surfaces of semiconductors 683 are coplanar. Subsequently, a dielectric 686, such as nitride, can be formed adjacent to semiconductors 683, dielectric liners 684, and dielectrics 685, as shown in FIGS. 6A and 6B.

Figure 6C:
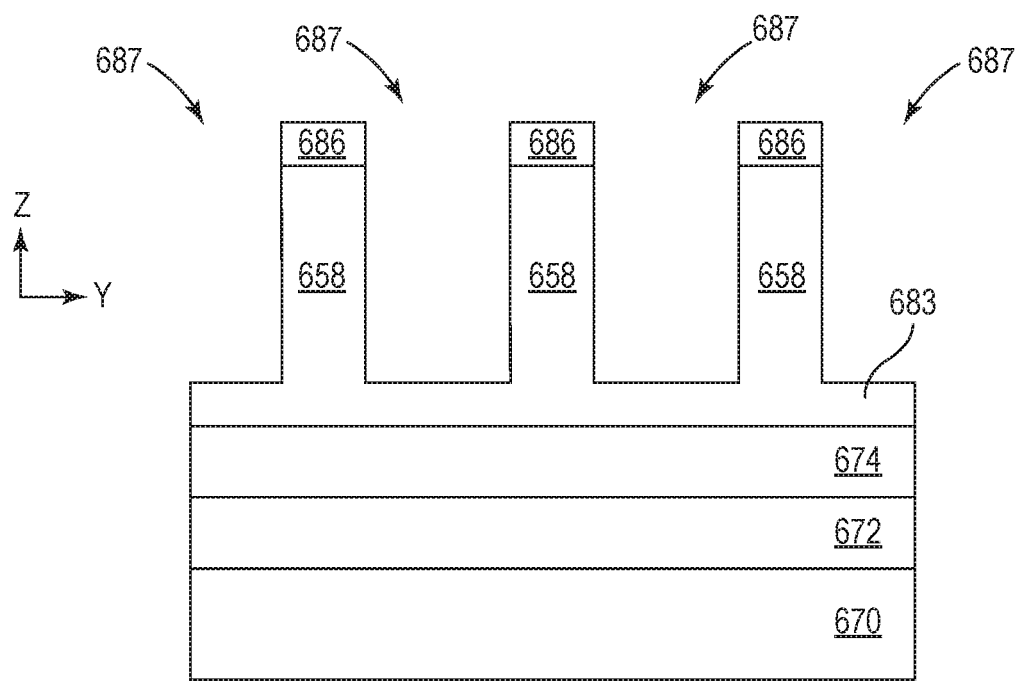

FIG. 6C is a cross-section (e.g., in the y-z plane) corresponding to a stage of processing following the stage of processing of FIGS. 6A and 6B in accordance with a number of embodiments of the present disclosure. In FIG. 6C, openings 687, such as trenches, are formed through dielectric 686 and in semiconductor 683 (e.g., stopping in semiconductor 683) to form semiconductor pillars 658 from semiconductor 683. Semiconductor pillars 658 can be semiconductor pillars 358 in FIG. 3, for example.

Openings 687 can extend in the x-direction (e.g., perpendicular to the face plane of FIG. 6C) and can be perpendicular to and intersect the openings in the y-direction in which dielectric liner 684 and dielectric 685 are formed in FIG. 6A. For example, a semiconductor pillar 658 can be between a pair of openings 687 in the x-direction and a pair of the openings in the y-direction that are intersected the pair openings 687.

Figure 6D:
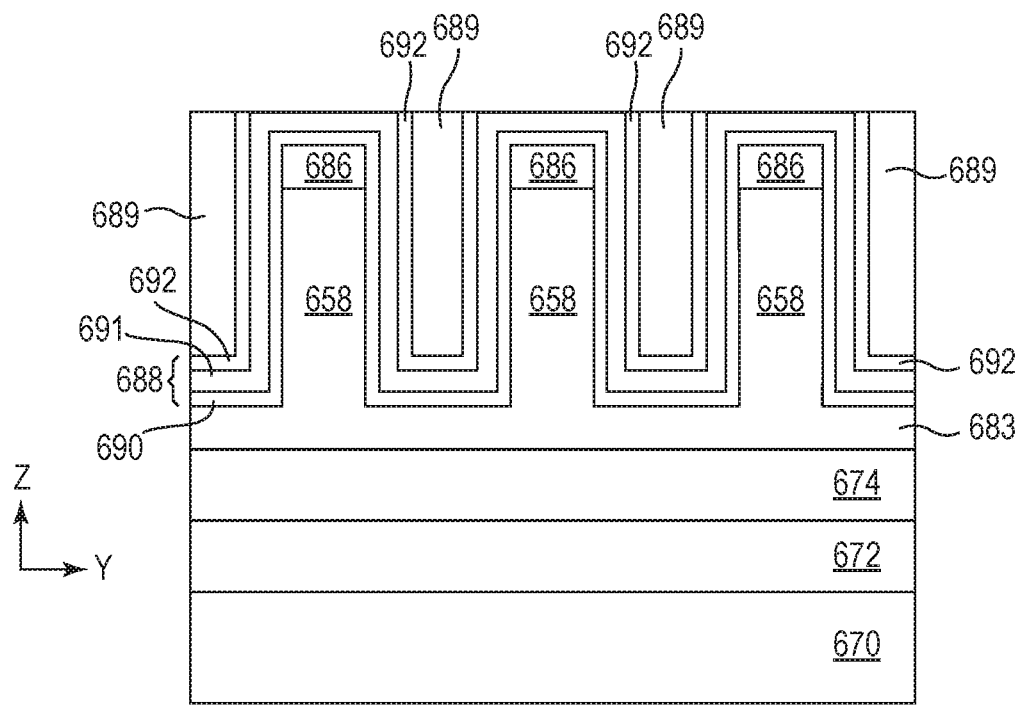

FIG. 6D is a cross-section (e.g., in the y-z plane) corresponding to a stage of processing following the stage of processing of FIG. 6C in accordance with a number of embodiments of the present disclosure. In FIG. 6D, a dielectric liner 688 can be formed in openings 687 in FIG. 6C adjacent to semiconductor 683, semiconductor pillars 658, and remaining dielectrics 686 to line openings 687. A dielectric 689, such as a spin-on dielectric, (e.g., oxide) can be formed in openings 687 adjacent to dielectric liner 688 (e.g., to fill the remainder of openings 687) and, for example, densified.

In various examples, dielectric liner 688 can include a dielectric 690, such as oxide, adjacent to semiconductor 683, semiconductor pillars 658, and dielectrics 686, a dielectric 691, such as nitride, adjacent to dielectric 690, and a dielectric 692, such as oxide, adjacent to dielectric 691. For example, dielectric liner 688 can be an ONO liner. Note, for example, that dielectric 689 can be adjacent to dielectric 692. In some instances, portions of dielectric liner 688 and dielectric 689 can extend over uppermost surfaces of dielectrics 686. The portions of dielectric 689 and portions of dielectric 692 that can extend over uppermost surfaces (e.g., the tops) of dielectrics 686 can be removed by CMP, stopping on (e.g., leaving) dielectric 691, as shown in FIG. 6D, such that the uppermost surfaces of dielectrics 689 and 691 and uppermost ends of dielectrics 692 are coplanar.

Figure 6E:
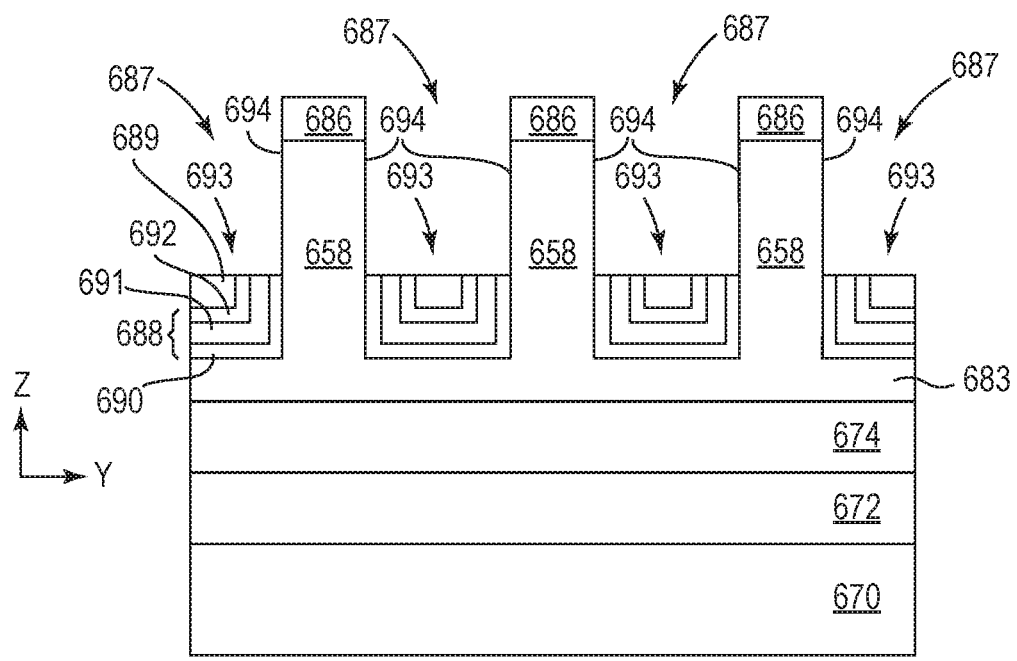

FIG. 6E is a cross-section (e.g., in the y-z plane) corresponding to a stage of processing following the stage of processing of FIG. 6D in accordance with a number of embodiments of the present disclosure. In FIG. 6E, openings 687 can be reformed (e.g., reopened), but with dielectric plugs 693 (e.g., spacers) partially filling openings 687 such that openings 687 terminate at uppermost surfaces (e.g., at the tops) of dielectric plugs 693. For example, dielectric plugs 693 can be adjacent to the bottoms of semiconductor pillars 658 and adjacent to sides (e.g., side surfaces) 694 of semiconductor pillars 658. Note that a semiconductor pillar 658 can be between adjacent dielectric plugs 693.

Openings 687 and dielectric plugs 693 can be formed by removing (e.g., by a wet etch) dielectric 691 and dielectric 690 from the uppermost surfaces of dielectrics 686 to expose the uppermost surfaces of dielectrics 686 and by removing (e.g., recessing) dielectric liner 688 and dielectric 689 (e.g., by the wet etch) to expose portions the sides 694 and stopping where the uppermost surfaces of dielectric plugs 693 are located. Note that dielectric plugs 693 can include the remainder of dielectric liner 688 and the remainder of dielectric 689. For example, an uppermost surface dielectric liner 688 (e.g., uppermost ends of dielectrics 690, 691, and 692) and an uppermost surface of dielectric 689 can be coplanar and can form the uppermost surfaces of dielectric plugs 693.

Figure 6F:
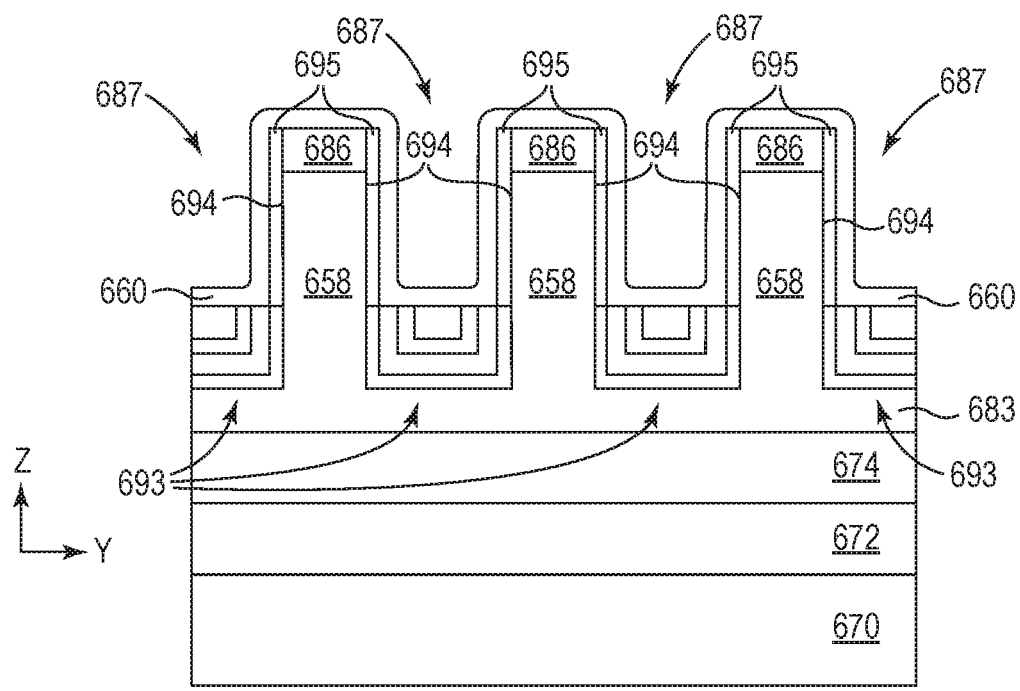

FIG. 6F is a cross-section (e.g., in the y-z plane) corresponding to a stage of processing following the stage of processing of FIG. 6E in accordance with a number of embodiments of the present disclosure. In FIG. 6F, dielectrics 695 (e.g., oxide) can be formed in openings 687 adjacent to opposing sides 694 of semiconductor pillars 658 such that dielectrics 695 terminate at the uppermost surfaces of dielectric plugs 693. Subsequently, openings 687 can be lined with a conductive liner 660 (e.g., titanium nitride, titanium, tungsten, among other metals or metal containing materials) by forming conductive liner 660 adjacent to dielectrics 695, adjacent to uppermost surfaces of dielectric plugs 693, and adjacent to the exposed the uppermost surfaces of dielectrics 686.

Figure 6G:
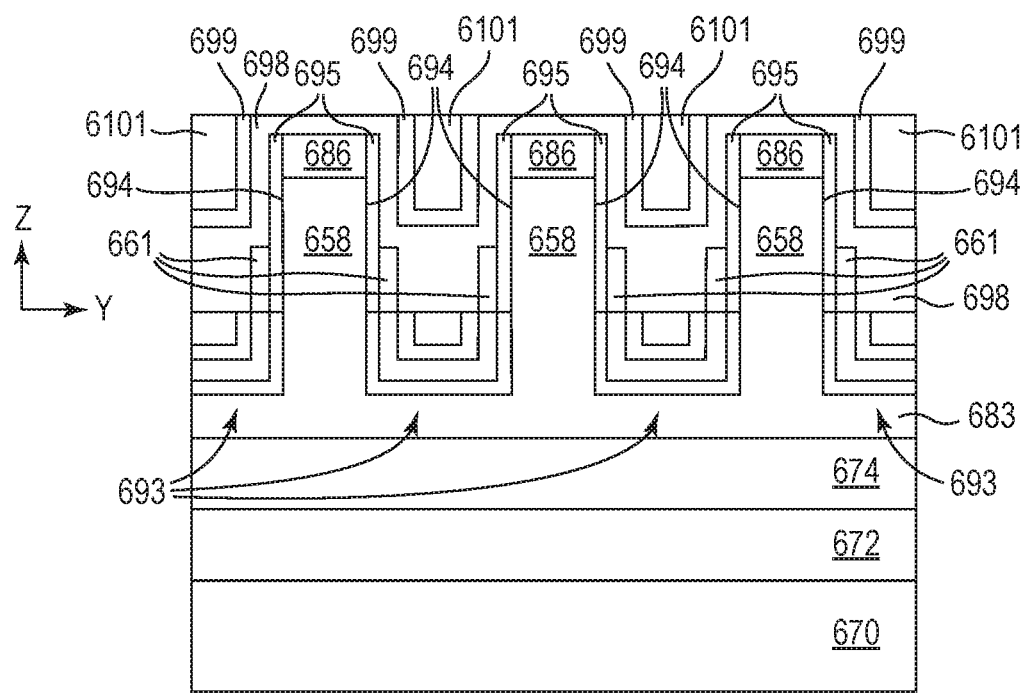

FIG. 6G is a cross-section (e.g., in the y-z plane) corresponding to a stage of processing following the stage of processing of FIG. 6F in accordance with a number of embodiments of the present disclosure. In FIG. 6G, conductive liner 660 can be removed (e.g., by a dry etch) from the uppermost surfaces of dielectrics 686, uppermost surfaces of dielectric plugs 693, and portions of dielectrics 695 that are adjacent to the opposing sides 694 of semiconductor pillars 658 such that remaining portions of conductive liner 660 form (e.g., planar) conductors 661. For example, conductors 661 can be adjacent to lower portions of dielectrics 695 between the uppermost surfaces of dielectric plugs 693 and the uppermost surfaces (e.g., the tops) of semiconductor pillars 658 and thus between the uppermost surfaces of dielectric plugs 693 and the uppermost surfaces of dielectrics 686. Conductors 661 can be adjacent to the uppermost surfaces of dielectric plugs 693, for example.

In various examples, conductors 661 can be the conductors 361 in FIG. 3. For example, conductors 661 on opposing sides of a semiconductor pillar 658 can respectively correspond to conductors 361-1 and 361-2. Note that dielectric plugs 693 can separate and can act to electrically isolate conductors 661 from conductor 674, such as to reduce the likelihood (e.g., to eliminate) electrical shorts between conductors 661 and conductor 674.

A dielectric 698 (e.g., nitride) can then be formed adjacent to conductors 661, dielectrics 695, the uppermost surfaces of dielectric plugs 693, and the uppermost surfaces of dielectrics 686. A dielectric 699 (e.g., oxide) can then be formed adjacent to dielectric 698. A dielectric 6101, such as a spin-on dielectric, (e.g., oxide) can be formed adjacent to dielectric 699 and, for example, densified. Subsequently, dielectric 699 and dielectric 6101 can be CMPed to remove dielectric 699 and dielectric 6101 from portions of dielectric 698 (e.g., stopping on portions of dielectric 698) adjacent to the uppermost surfaces of dielectrics 686 such that uppermost surfaces of remaining dielectrics 6101, uppermost surfaces of dielectric 698, and uppermost ends of remaining dielectrics 699 are coplanar.

Figure 6H:
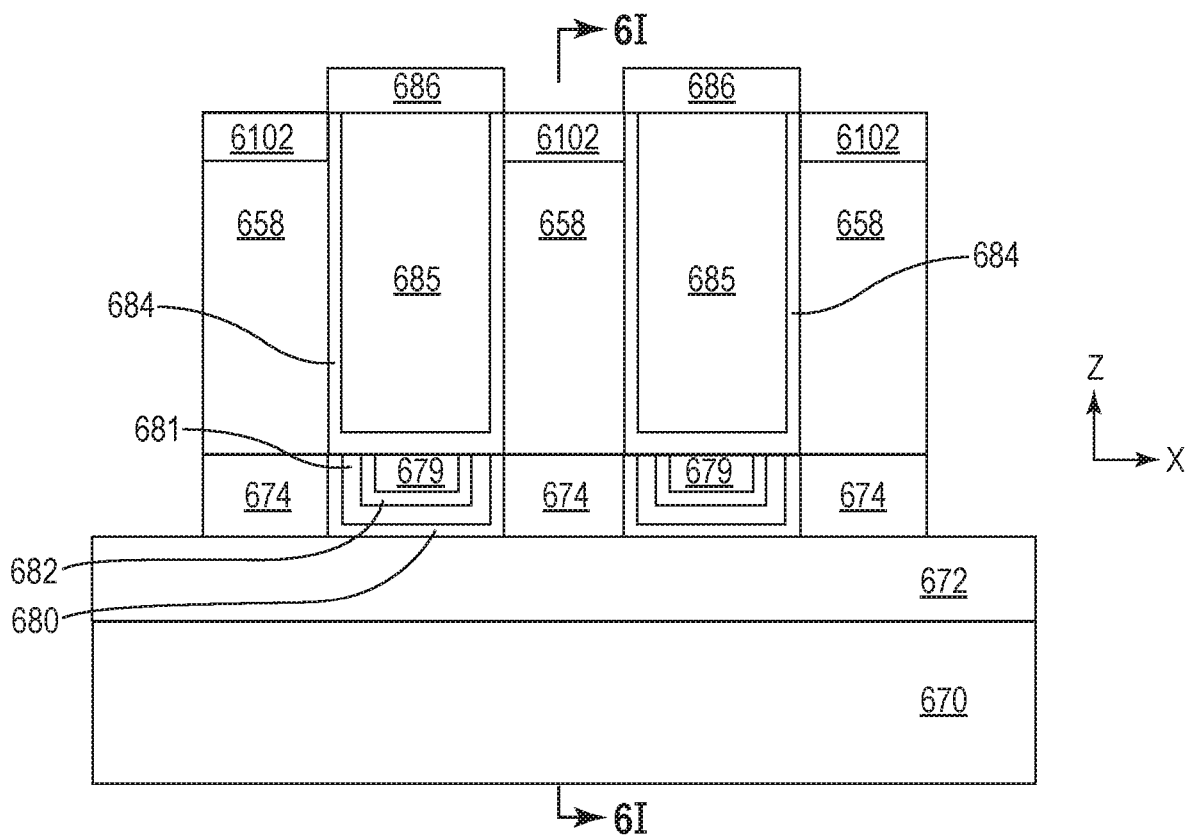
Figure 6I:
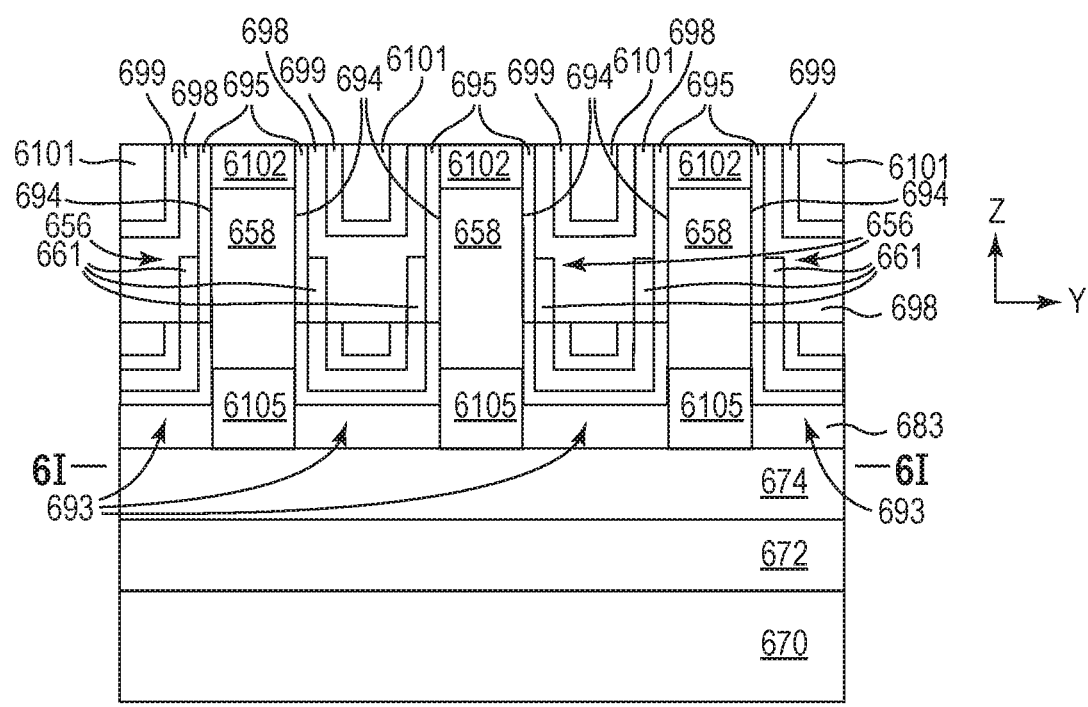

FIG. 6H is a cross-section (e.g., in the x-z plane) corresponding to a stage of processing following the stage of processing of FIG. 6G in accordance with a number of embodiments of the present disclosure. For example, the cross-section in FIG. 6H corresponds to the cross-section in FIG. 6A. FIG. 6I is a cross-section (e.g., in the y-z plane) viewed along the line 6I-6I in FIG. 6H and corresponding to the stage of processing in FIG. 6H in accordance with a number of embodiments of the present disclosure. For example, the structures in FIGS. 6H and 6I can be formed concurrently.

Dielectrics 686 and portions of dielectrics 695, 698, 699, and 6101 are removed (e.g., by a dry etch), stopping at the level of the uppermost surfaces of semiconductor pillars 658 such that the uppermost surfaces of semiconductor pillars 658 are exposed, as shown in FIGS. 6H and 6I, and are coplanar with uppermost ends of dielectrics 698 and 699 and uppermost surfaces of dielectrics 6101, as shown in FIG. 6I. As shown in FIGS. 6H and 6I, source/drains 6102, such as conductive implants, (e.g., having an $n^+$ conductivity type) can then be formed (e.g., implanted) in the semiconductor pillars 658 through the exposed uppermost surfaces of semiconductor pillars 658 such that the source/drains 6102 extend from the uppermost surfaces of semiconductor pillars 658 into semiconductor pillars 658, as shown in FIGS. 6H and 6I. For example, source/drains 6102 can be formed by conductively doping semiconductor pillars 658 (e.g., to the $n^+$ conductivity type).

In some examples semiconductor 683 can be conductively doped (e.g., to the $n^+$ conductivity type). For example, portions of semiconductor 683 between the dielectric plugs 693 can be conductively doped to form source/drains 6105 that can, in some examples, extend into semiconductor pillars 658.

In various examples, each of the semiconductor pillars 658 can correspond to a vertical TFT 656 that can be a vertical TFT 356 in FIG. 3. For example, a vertical TFT 656 can be a vertical TFT 235-1 or 235-2 (e.g., a multiplexing TFT) or a vertical TFT 238-1 or 238-2 (e.g., a pre-charge TFT) in FIG. 2.

A semiconductor pillar 658 can be a channel region of a vertical TFT 656; the dielectrics 695 adjacent to opposing sides of the semiconductor pillar 658 can be the gate dielectric of the vertical TFT 656; the conductors 661 on opposing sides 694 of the semiconductor pillar 658 adjacent to the dielectrics 695 can be the gate of the vertical TFT 656; and source/drains 6102 and 6105 can be source/drains of the vertical TFT 656 such that conductors 661 can be between source/drains 6102 and 6105. The gate can be a planar gate, for example, that does not wrap completely around semiconductor pillar 658. Note that source/drains 6105 can electrically couple the vertical TFT 656 to conductor 674.

Figure 7A:
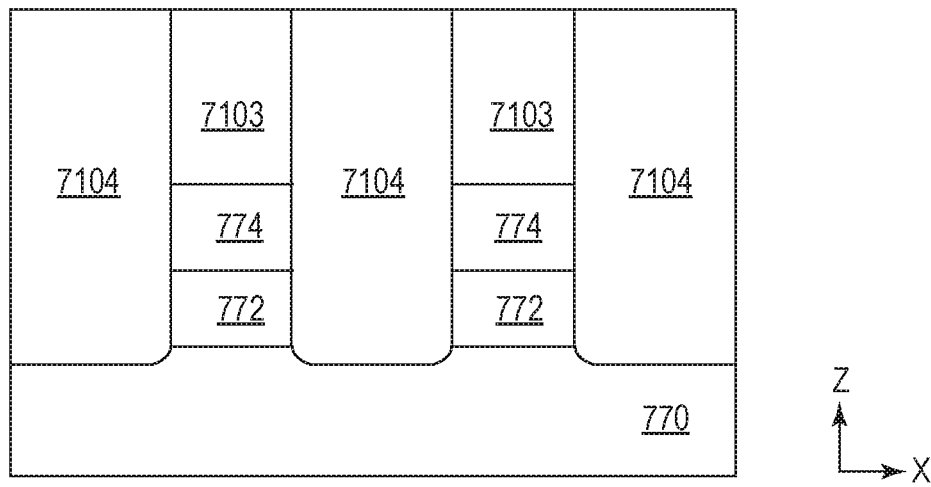
FIGS. 7A to 7N are cross-sectional views corresponding to particular stages of processing associated with forming vertical transistors in accordance with a number of embodiments of the present disclosure.
Figure 7B:
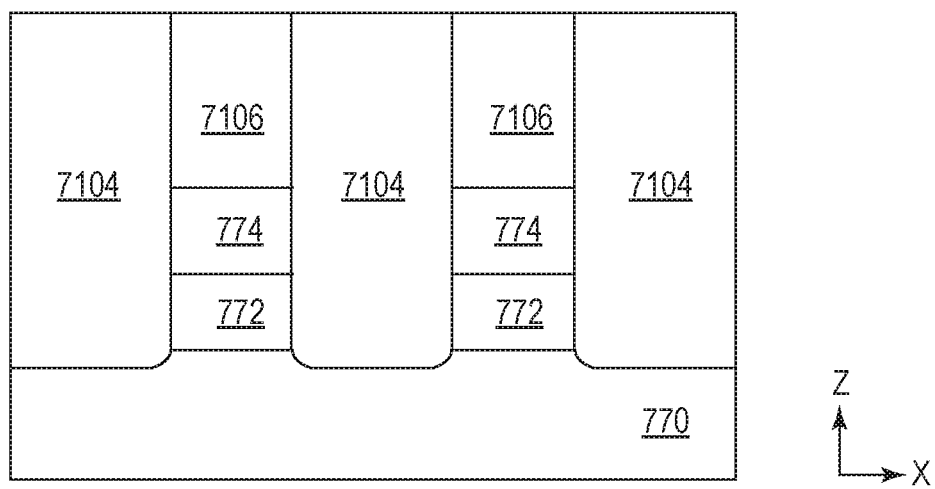
Figure 7C:
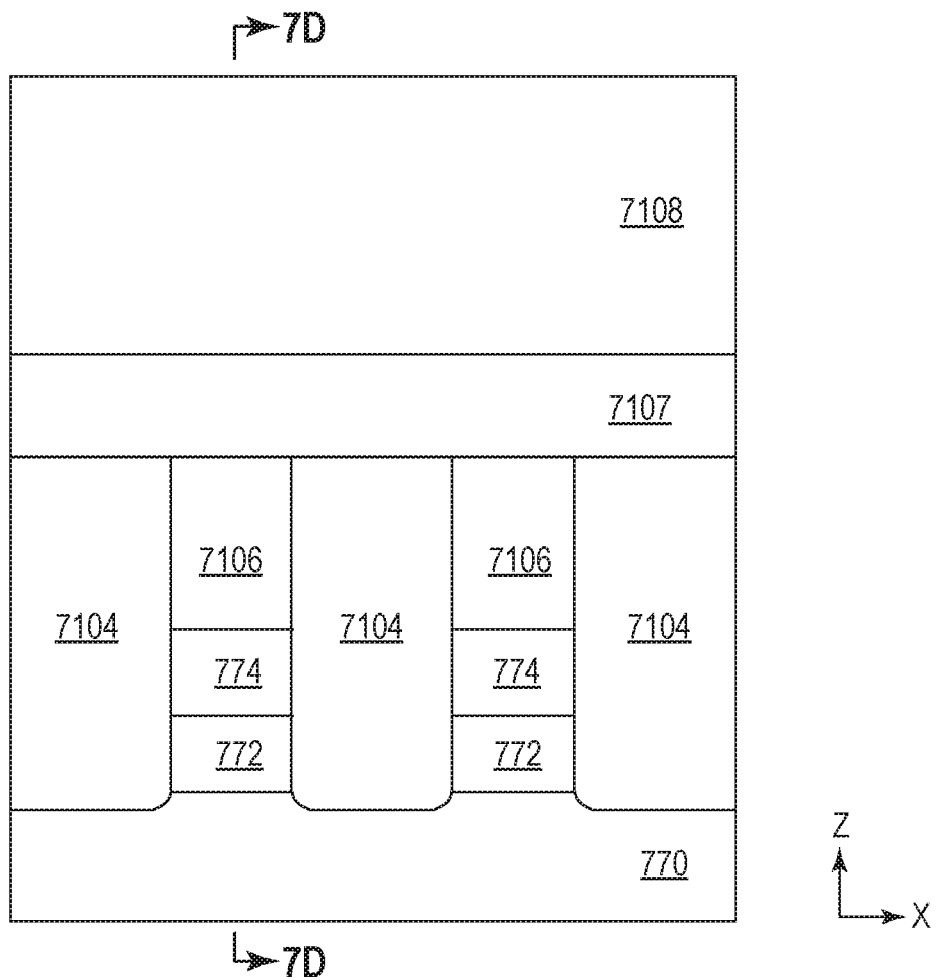
Figure 7D:
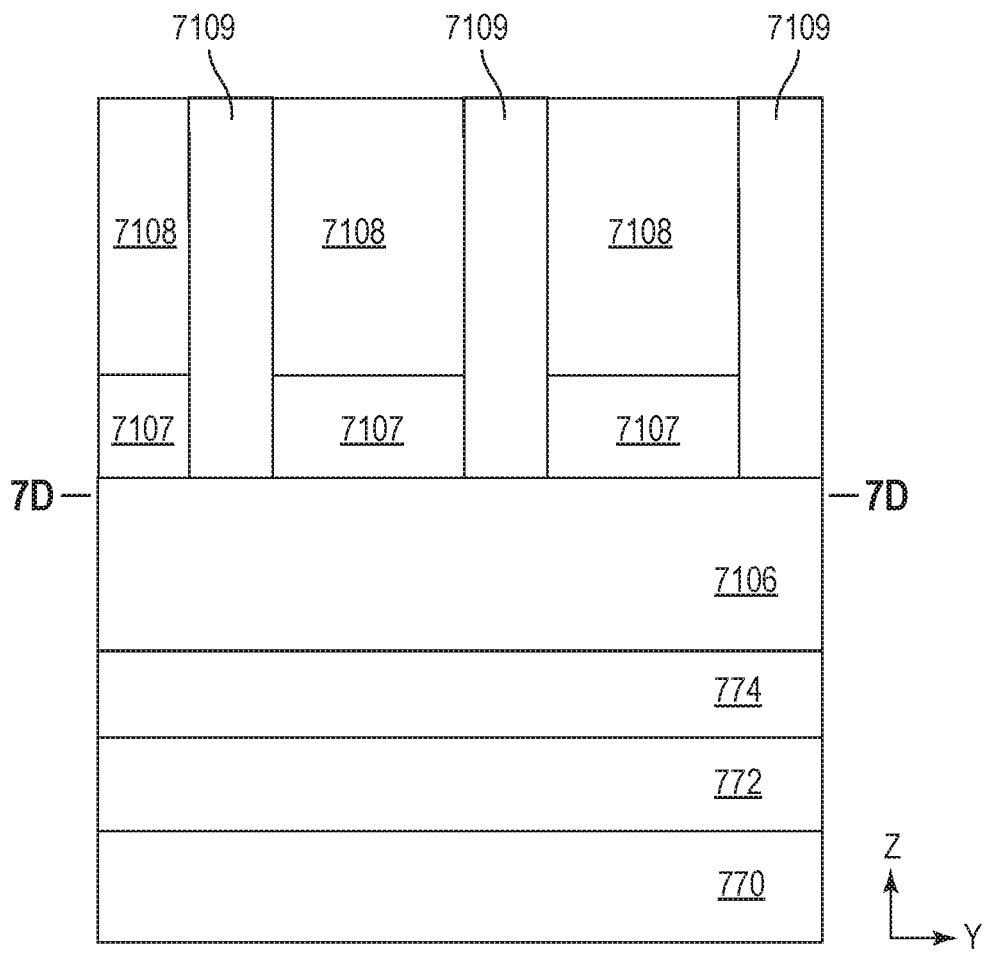
Figure 7E:
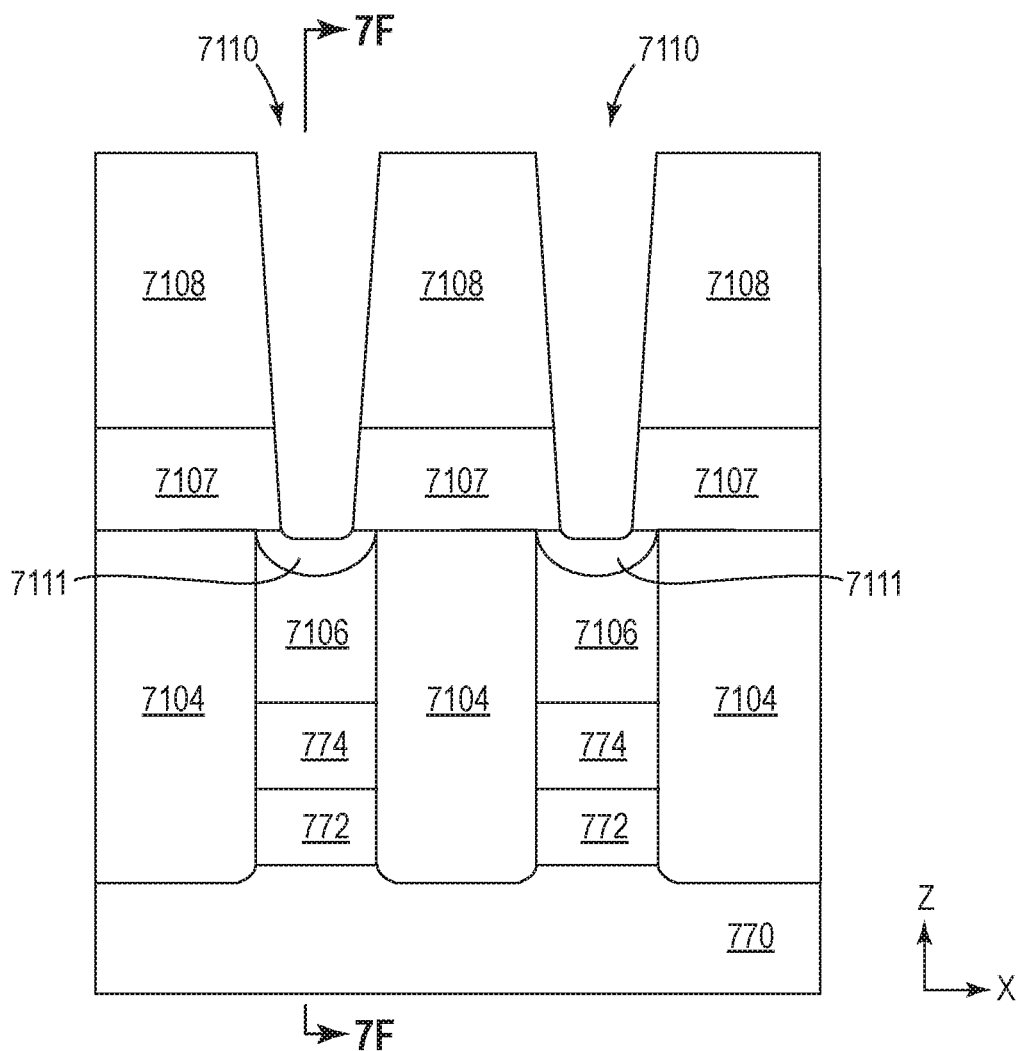
Figure 7F:
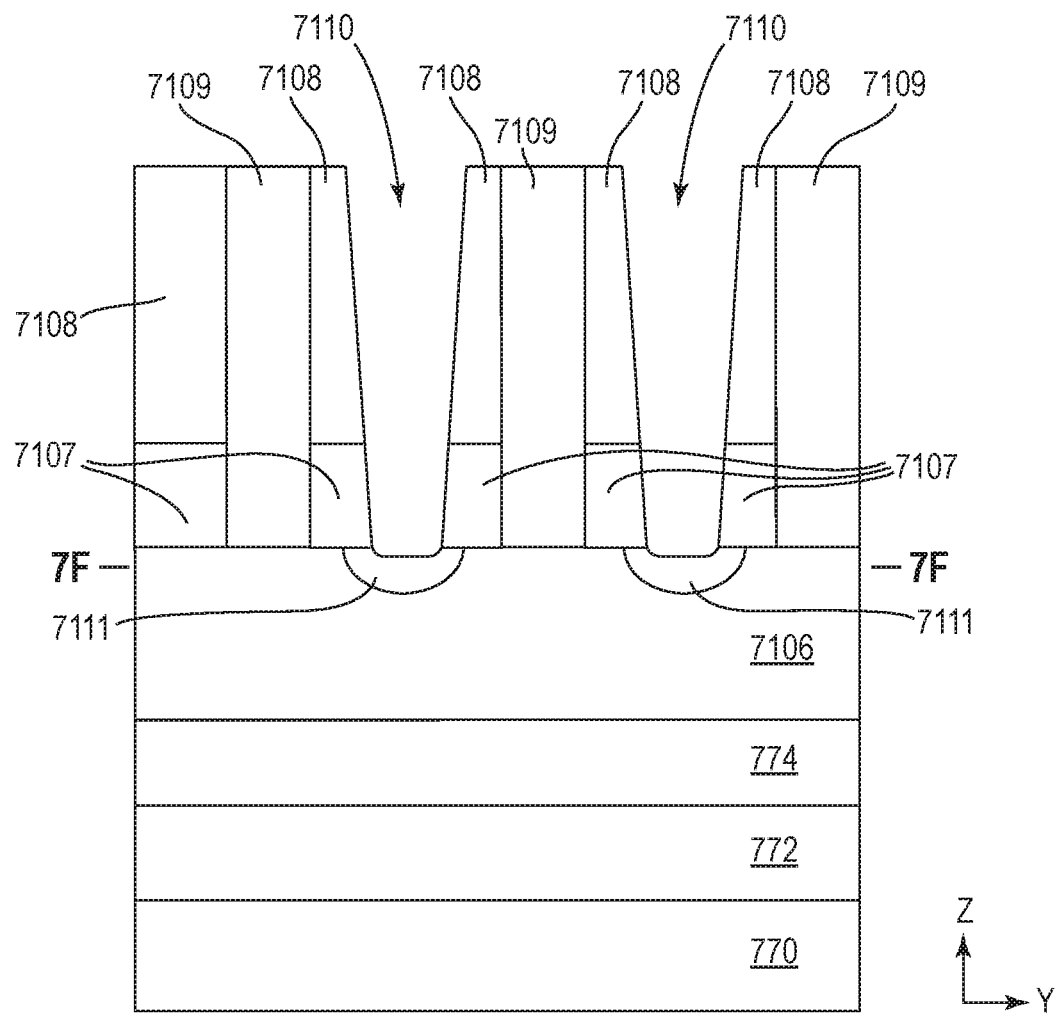
Figure 7G:
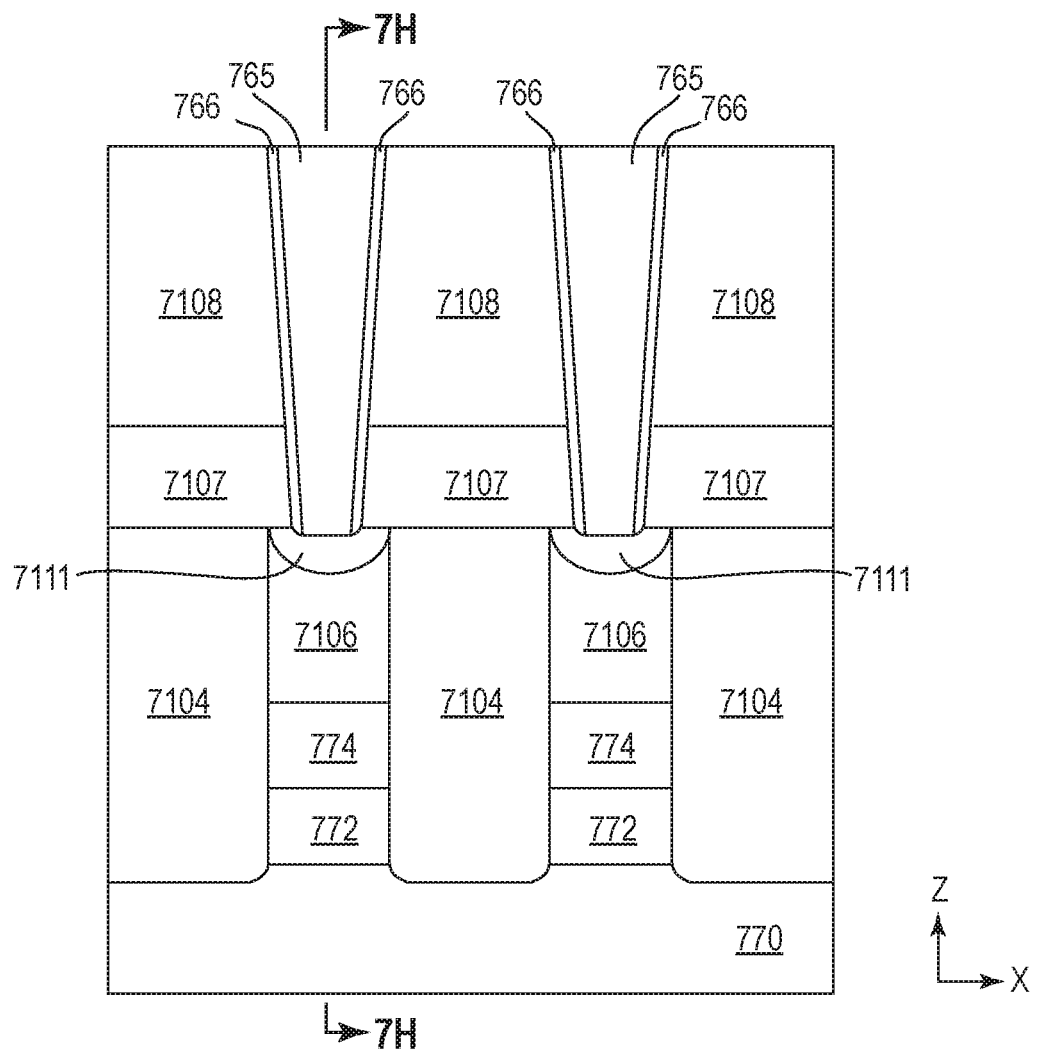
Figure 7H:
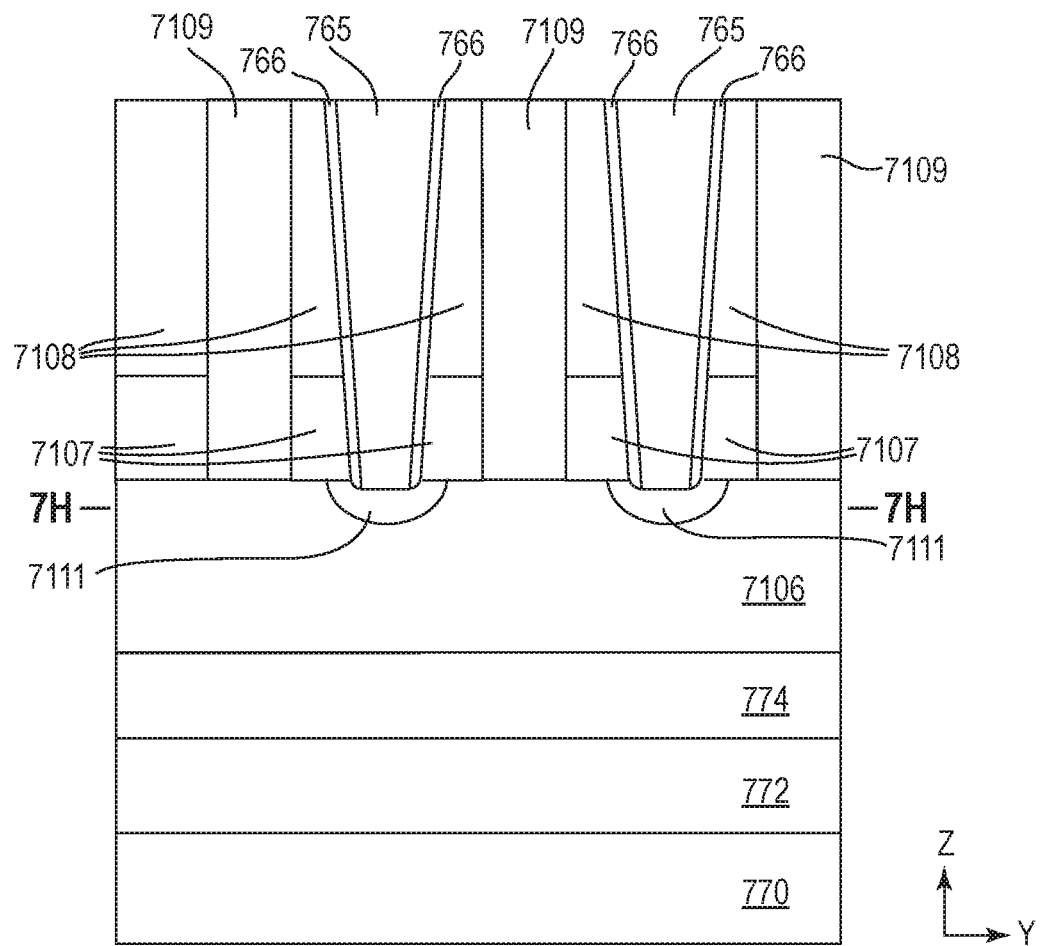
Figure 7I:
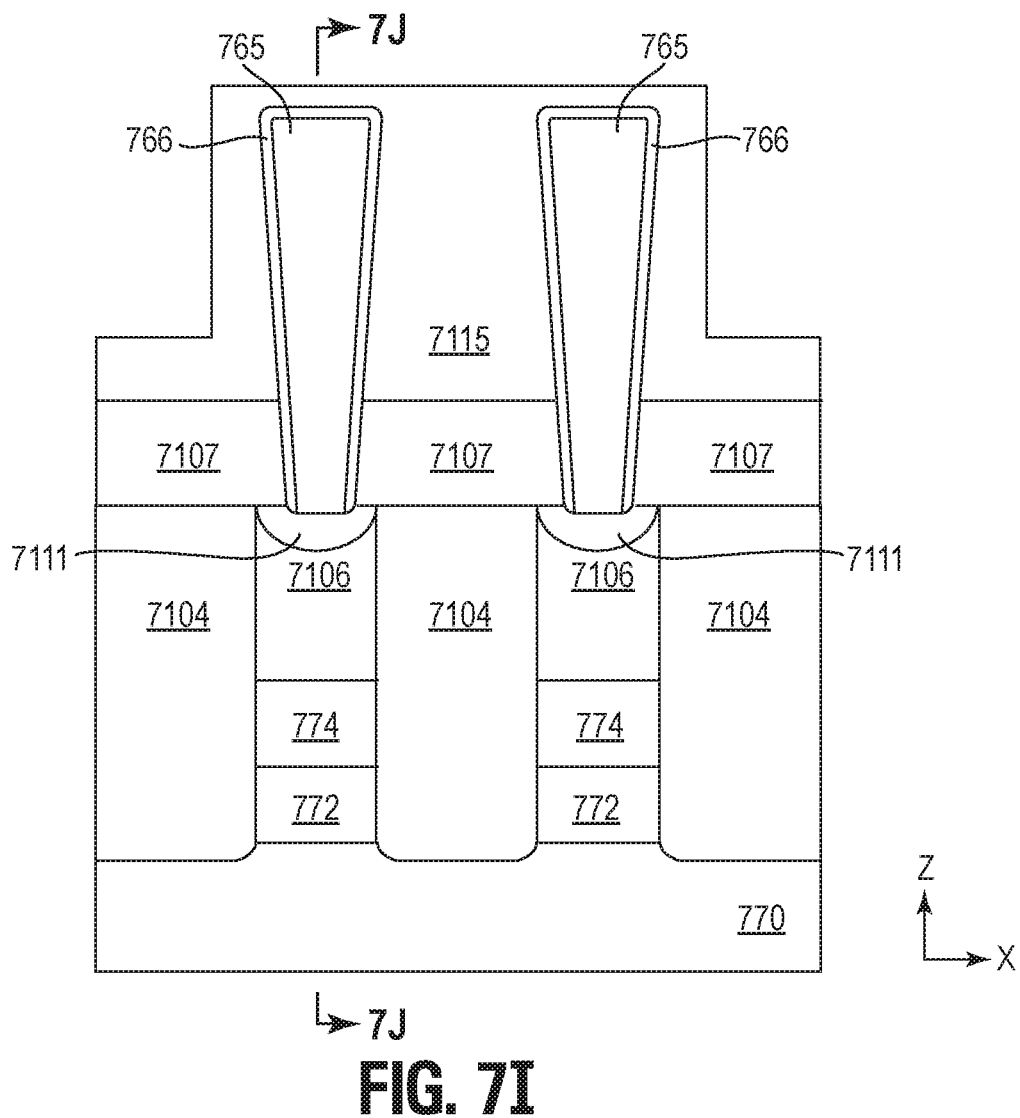
Figure 7J:
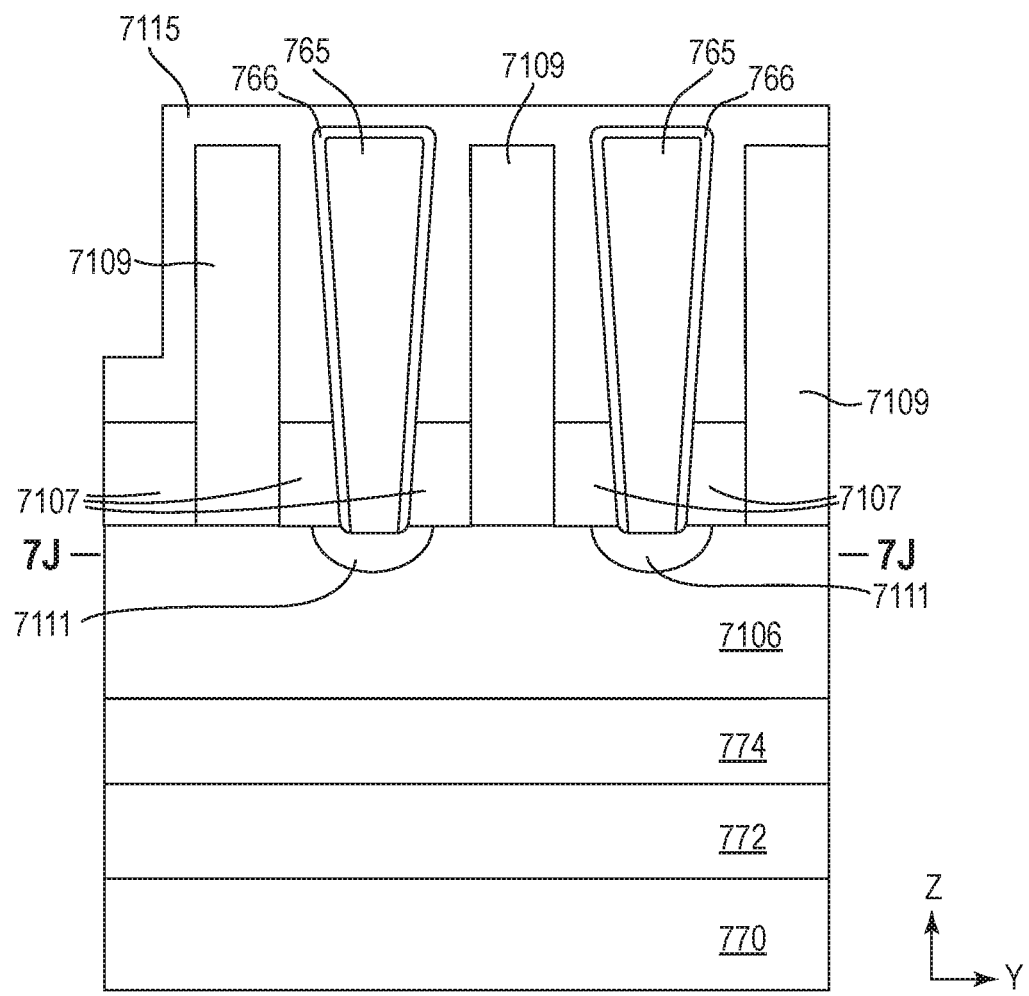
Figure 7K:
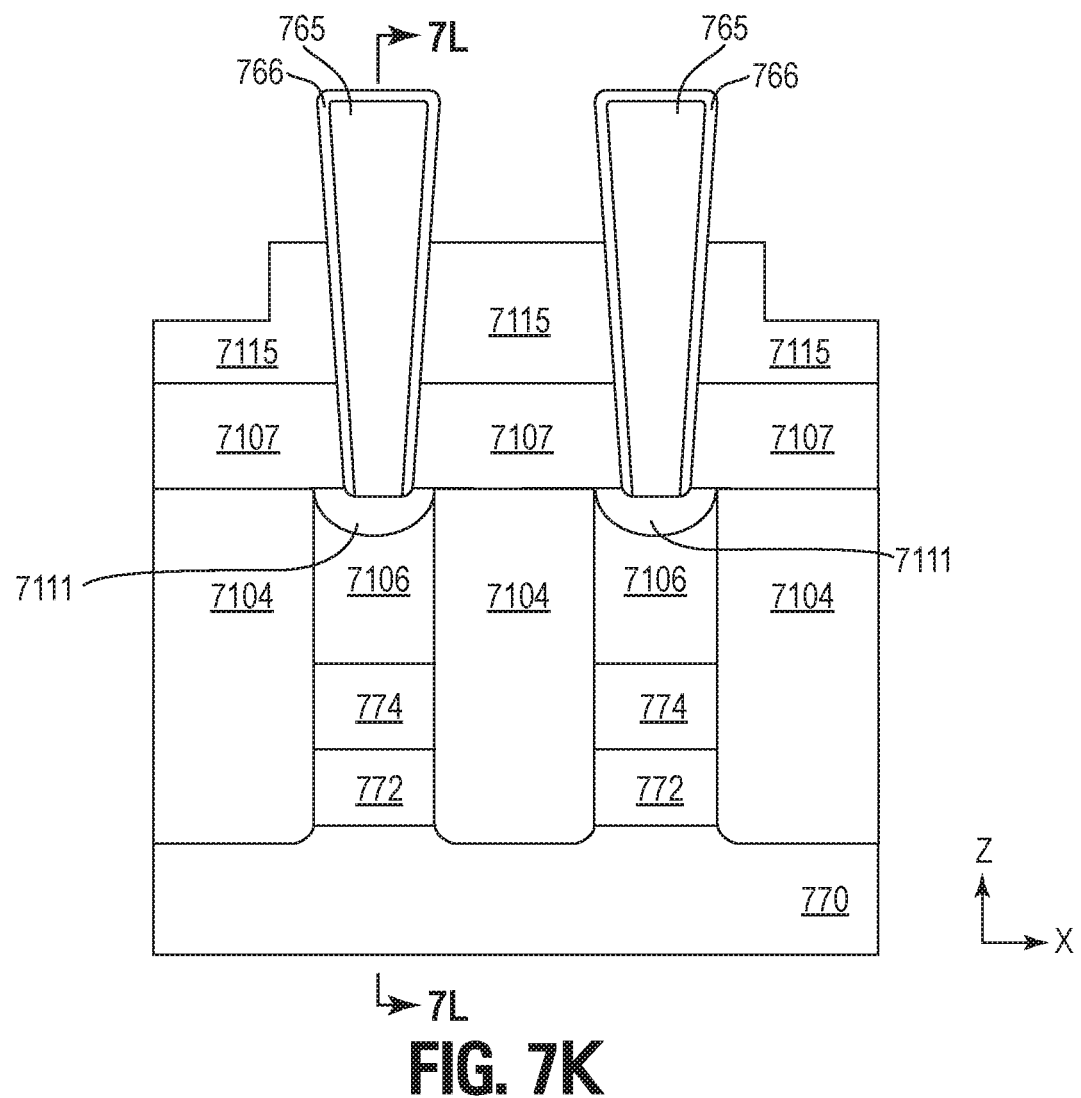
Figure 7L:
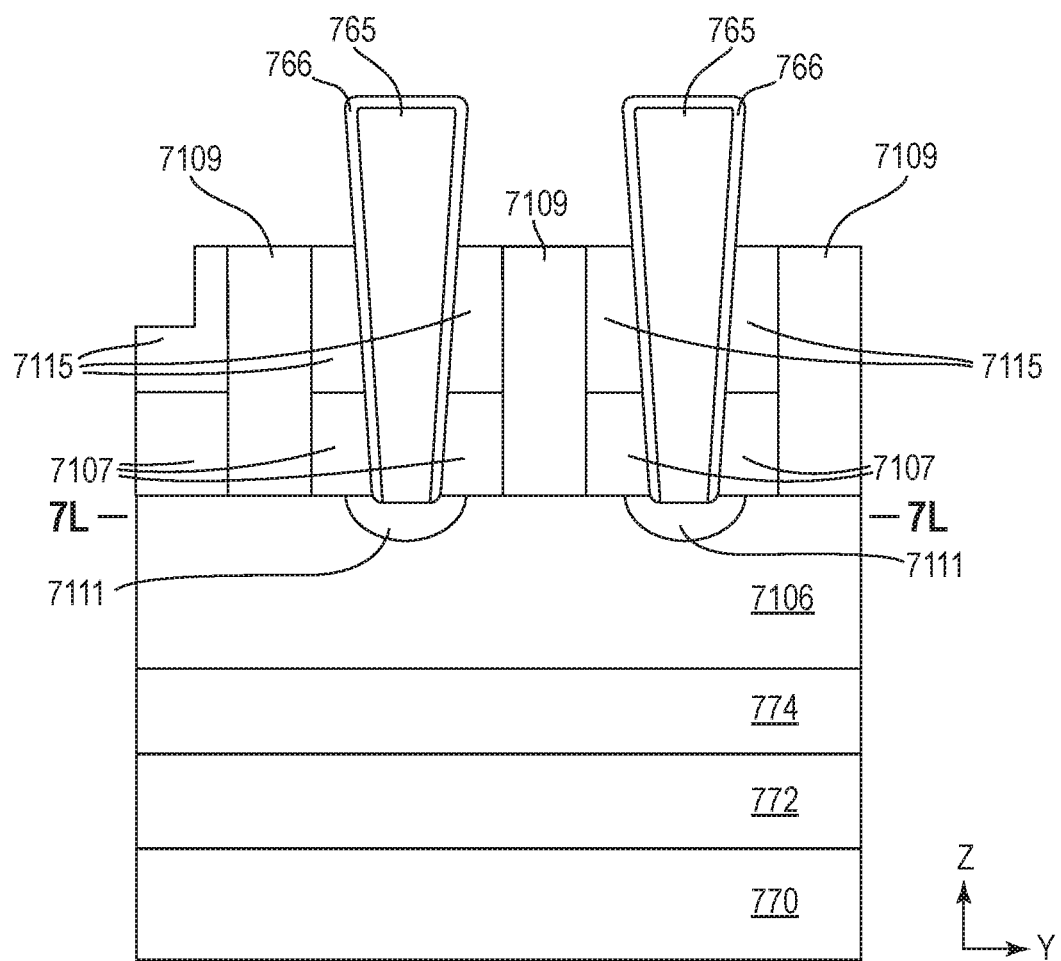
Figure 7M:
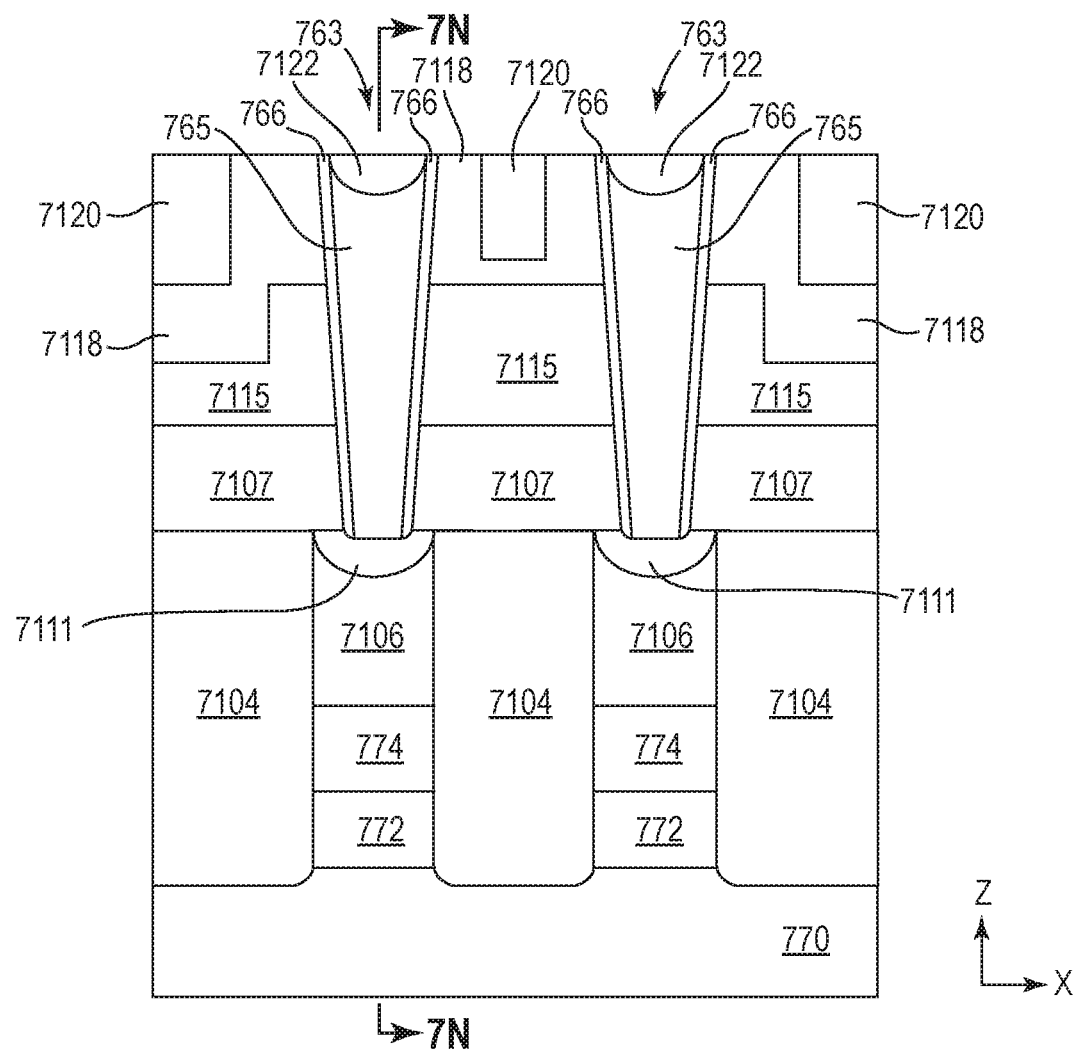
Figure 7N:
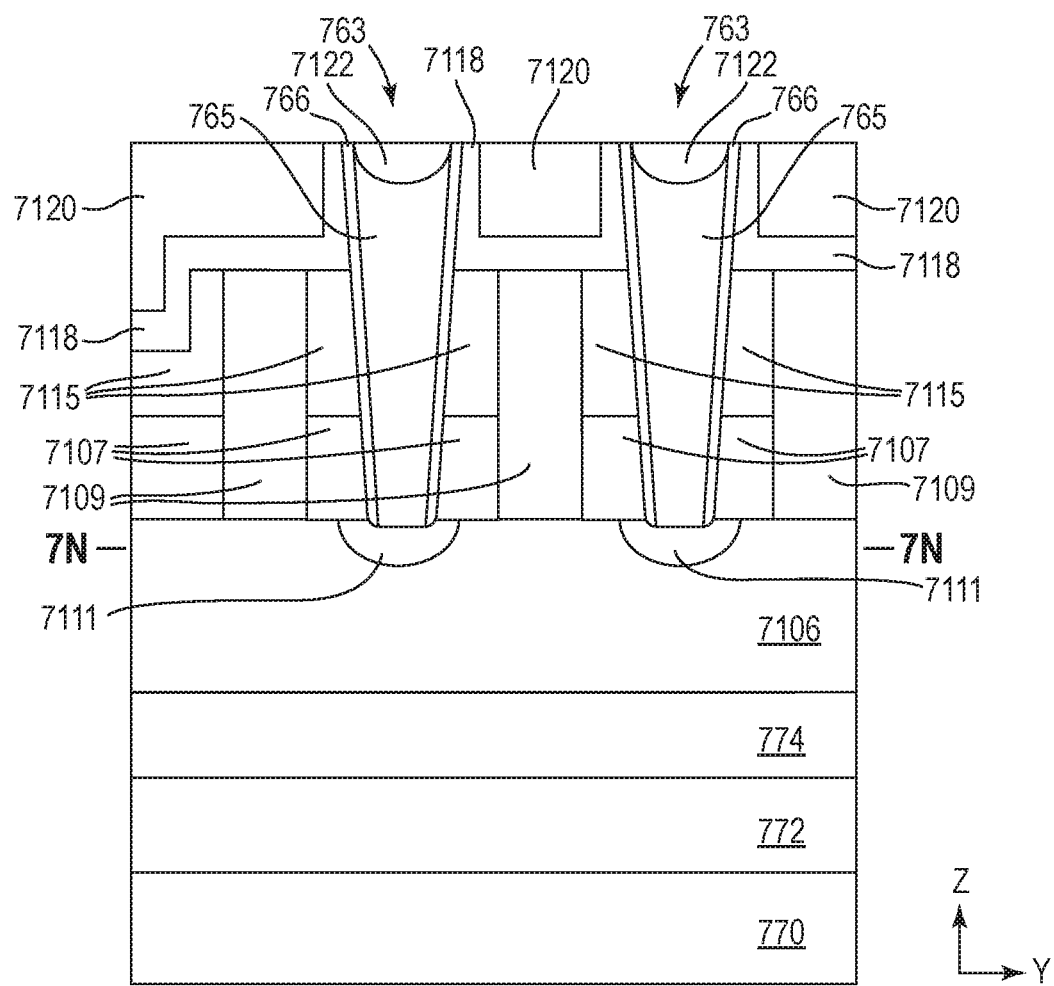

FIGS. 7A to 7N are cross-sectional views corresponding to particular stages of processing associated with forming vertical TFTs in accordance with a number of embodiments of the present disclosure. For example, the vertical TFTs can be formed in region 510 in FIG. 5B. FIGS. 7A to 7N illustrate, for example, how vertical TFTs can be integrated in a shunt region, such as region 210. In some examples the vertical TFTs formed in FIGS. 7A to 7N can be vertical TFTs 463 in FIG. 4.

FIG. 7A is a cross-section (e.g., in the x-z plane) corresponding to a processing stage that can occur after a number of processing stages have occurred in accordance with a number of embodiments of the present disclosure. For example, FIG. 7A can correspond to region 510 in FIG. 5B and can be perpendicular to the plane of FIG. 5B.

In FIG. 7A, a dielectric 772 (e.g., oxide), that can be dielectric 572, can be formed adjacent to a semiconductor 770, such as a monocrystalline semiconductor (e.g., monocrystalline silicon), that can be semiconductor 570. A conductor 774, such as metal (e.g., tungsten, titanium, among other metals), can be formed adjacent to dielectric 772. A dielectric 7103 (e.g., nitride) can be formed adjacent to conductor 774. In various examples, conductor 577-1, conductor 577-2, or bus 525 can correspond to conductor 774.

Openings can then be formed through dielectric 7103, conductor 774, and dielectric 772, stopping on or in semiconductor 770. For example, portions of dielectric 7103, conductor 774, and dielectric 772 can be removed to form the openings. The openings can extend in the y-direction (e.g., perpendicular to the face plane of FIG. 7A). Dielectrics 7104 (e.g., oxide) can be formed in the openings adjacent to (e.g., lateral to and in direct physical contact with) sides of remaining dielectrics 7103, remaining conductors 774, and remaining dielectrics 772 and portions of semiconductor 770. In some instances, portions of dielectrics 7104 that can extend over uppermost surfaces (e.g., the tops) of dielectrics 7103 can be removed by CMP such that uppermost surfaces (e.g., tops) of dielectrics 7104 are coplanar with the uppermost surfaces of dielectrics 7103.

FIG. 7B is a cross-section (e.g., in the x-z plane) corresponding to a stage of processing following the stage of processing of FIG. 7A in accordance with a number of embodiments of the present disclosure. In FIG. 7B, dielectrics 7103 can be removed (e.g., by an etch selective thereto) to form openings in place of dielectrics 7103. For examples in which dielectric is nitride, a hot phosphoric acid etch selective to nitride can be used.

Subsequently, semiconductors 7106, such as polysilicon, can be formed in the openings. In some instances, portions of semiconductors 7106 that can extend over an uppermost surface of dielectric 7103 can be removed by CMP, stopping at the uppermost surfaces (e.g., the tops) of dielectrics 7104 such that the uppermost surfaces semiconductors 7106 are coplanar with the uppermost surfaces of dielectrics 7104. In various instances, an interface metallic (e.g., that can be titanium nitride) can be formed adjacent to conductors 774, and semiconductors 7106 can be formed adjacent to the interface metallic such that the interface metallic is between conductors 774 and semiconductors 7106.

FIG. 7C is a cross-section (e.g., in the x-z plane) corresponding to a stage of processing following the stage of processing of FIG. 7B in accordance with a number of embodiments of the present disclosure. FIG. 7D is a cross-section (e.g., in the y-z plane) viewed along line 7D-7D in FIG. 7C and corresponding to the stage of processing in FIG. 7C in accordance with a number of embodiments of the present disclosure. For example, the structures in FIGS. 7C and 7D can be formed concurrently.

A dielectric 7107 (e.g., a dielectric material), such as oxide, can be formed adjacent to dielectrics 7106 in FIG. 7C and the dielectric 7106 in FIG. 7D. A dielectric 7108 (e.g., a dielectric material), such as nitride, can be formed adjacent to dielectric 7107. As shown in FIG. 7D, isolation regions 7109 can be formed through dielectric 7107 and dielectric 7108, stopping on or in semiconductor 7106. For example, isolation regions 7109 can be formed from a dielectric, such as oxide, by forming openings through dielectric 7107 and dielectric 7108, stopping on or in semiconductor 7106, and forming the dielectric in the openings (e.g., filling the openings with the dielectric). In some instances, portions of isolation regions 7109 that can extend over uppermost surfaces (e.g., the tops) of the remaining dielectrics 7108 in FIG. 7D can be removed by CMP, stopping at the uppermost surfaces of dielectrics 7108, such that uppermost surfaces of isolation regions 7109 are coplanar with the uppermost surfaces of the dielectrics 7108.

FIG. 7E is a cross-section (e.g., in the x-z plane) corresponding to a stage of processing following the stage of processing of FIGS. 7C and 7D in accordance with a number of embodiments of the present disclosure. FIG. 7F is a cross-section (e.g., in the y-z plane) viewed along line 7F-7F in FIG. 7E and corresponding to the stage of processing in FIG. 7E in accordance with a number of embodiments of the present disclosure. For example, the structures in FIGS. 7E and 7F can be formed concurrently.

In FIGS. 7E and 7F, openings 7110 can be formed through dielectrics 7107 and 7108 by removing portions of dielectrics 7107 and 7108 and stopping on or in semiconductors 7106 to expose semiconductors 7106. For example, openings 7110 can be formed between isolation regions 7109, as shown in FIG. 7F. In various examples, openings 7110 can be discrete openings (e.g., discrete circular, oval, or elliptical openings or the like). In various instances, source/drains 7111 can be formed in the exposed semiconductors 7106, such as by conductively doping the exposed semiconductors 7106 (e.g., to the n$^+$ conductivity type) through openings 7110.

FIG. 7G is a cross-section (e.g., in the x-z plane) corresponding to a stage of processing following the stage of processing of FIGS. 7E and 7F in accordance with a number of embodiments of the present disclosure. FIG. 7H is a cross-section (e.g., in the y-z plane) viewed along line 7H-7H in FIG. 7G and corresponding to the stage of processing in FIG. 7G in accordance with a number of embodiments of the present disclosure. For example, the structures in FIGS. 7G and 7H can be formed concurrently.

In FIGS. 7G and 7H, openings 7110 can be lined with dielectrics 766 (e.g., oxide) such that semiconductors 7106 (e.g., source/drains 7111) are exposed at the bottoms of openings 7110. For example, dielectrics 766 can be formed adjacent to dielectrics 7107 and 7108. In some examples, dielectrics 766 can be referred to as dielectric liners. Semiconductor structures (e.g., polysilicon structures), such as semiconductor pillars 765 that can be semiconductor pillars 465 in FIG. 4, can then be formed in openings 7110 adjacent to dielectrics 766 and exposed semiconductors 7106, as shown in FIGS. 7G and 7H. For example, uppermost ends (e.g., tops) of dielectrics 766 and uppermost surfaces (e.g., tops) of semiconductor pillars 765 can be coplanar with uppermost surfaces of isolation regions 7109 and dielectrics 7108.

FIG. 7I is a cross-section (e.g., in the x-z plane) corresponding to a stage of processing following the stage of processing of FIGS. 7G and 7H in accordance with a number of embodiments of the present disclosure. FIG. 7J is a cross-section (e.g., in the y-z plane) viewed along line 7J-7J in FIG. 7I and corresponding to the stage of processing in FIG. 7I in accordance with a number of embodiments of the present disclosure. For example, the structures in FIGS. 7I and 7J can be formed concurrently.

In FIGS. 7I and 7J, dielectrics 7108 can be removed (e.g., by a hot phosphoric acid etch) to expose portions of dielectrics 766 and uppermost surfaces of dielectrics 7107. The exposed portions of dielectrics 766 can be converted to gate dielectrics by adding an additional dielectric material to the exposed portions of 766. For example, the additional dielectric material can also form adjacent to the uppermost surfaces of semiconductor pillars 765. Dielectrics 766 can be gate dielectrics 466 in FIG. 4, for example, and can wrap completely around semiconductor pillars 765.

Adding the additional dielectric material to dielectrics 766 can also repair any damage to dielectrics 766. In examples in which dielectrics 766 are oxide, the additional dielectric material can be gate oxide and can be added by oxidizing dielectrics 766 and the uppermost surfaces of semiconductor pillars 765 with gate oxide. Subsequently, a conductor 7115 (e.g., titanium nitride, titanium, tungsten, among other metals or metal containing materials) can be formed adjacent to dielectrics 766, isolation regions 7109, and the exposed uppermost surfaces of dielectrics 7107, as shown in FIGS. 7I and 7J.

FIG. 7K is a cross-section (e.g., in the x-z plane) corresponding to a stage of processing following the stage of processing of FIGS. 7I and 7J in accordance with a number of embodiments of the present disclosure. FIG. 7L is a cross-section (e.g., in the y-z plane) viewed along line 7L-7L in FIG. 7K and corresponding to the stage of processing in FIG. 7K in accordance with a number of embodiments of the present disclosure. For example, the structures in FIGS. 7K and 7L can be formed concurrently.

In FIGS. 7K and 7L, a portion of conductor 7115 and portions of isolation regions 7109 are removed (e.g., recessed), such as by a dry etch, such that portions of dielectrics 766 are exposed. For example, portions of semiconductor pillars 765 covered by dielectrics 766 can extend above an uppermost surface of remaining conductor 7115 in FIG. 7K and uppermost surfaces of remaining conductors 7115 in FIG. 7L.

In FIG. 7L, respective conductors 7115 can correspond to respective semiconductor pillars 765 and are adjacent to respective dielectrics 766 adjacent to the respective semiconductor pillars 765. For example, the respective conductors 7115 can wrap completely around the respective dielectrics 766, and thus completely around the respective semiconductor pillars 765, such that the respective dielectrics 766 can be between the respective conductors 7115 and the respective semiconductor pillars 765. An isolation region 7109 can be between the respective semiconductor pillars 765 and can electrically isolate the respective conductors 7115 corresponding to respective semiconductor pillars 765 from each other.

FIG. 7M is a cross-section (e.g., in the x-z plane) corresponding to a stage of processing following the stage of processing of FIGS. 7K and 7L in accordance with a number of embodiments of the present disclosure. FIG. 7N is a cross-section (e.g., in the y-z plane) viewed along line 7N-7N in FIG. 7M and corresponding to the stage of processing in FIG. 7K in accordance with a number of embodiments of the present disclosure. For example, the structures in FIGS. 7K and 7L can be formed concurrently.

In FIGS. 7M and 7N, a dielectric 7118, such as nitride, can be formed adjacent to conductor 7115, isolation regions 7109, dielectrics 766, and semiconductor pillars 765. A dielectric 7120, such as a spin-on dielectric, (e.g., oxide) can be formed adjacent to dielectric 7118 and, for example, densified. Subsequently, portions of dielectrics 7118 and 7120 can be removed (e.g. dielectrics 7118 and 7120 can be etched back), such as by a dry etch, such that the uppermost surfaces of semiconductor pillars 765 are exposed and uppermost surfaces of remaining dielectrics 7118 and 7120 are coplanar with the uppermost surfaces of semiconductor pillars 765. In various instances, source/drains 7122 can be formed in semiconductor pillars 765 adjacent to the exposed uppermost surfaces of semiconductor pillars 765, such as by conductively doping semiconductor pillars 765 (e.g., to the $n^+$ conductivity type). For example, source/drains 7122 can extend from the uppermost surfaces of semiconductor pillars 765 into semiconductor pillars 765.

In various examples, each of the semiconductor pillars 765 can correspond to a vertical TFT 763 that can be a vertical TFT 463 in FIG. 4. For example, a vertical TFT 763 can be a vertical TFT 228-1 or 228-2 (e.g., a sense amplifier TFT), a vertical TFT 235-1 or 235-2 (e.g., a multiplexing TFT) or a vertical TFT 238-1 or 238-2 (e.g., a pre-charge TFT) in FIG. 2.

A semiconductor pillar 765 can be a channel region of a vertical TFT 763; the dielectric 766 adjacent to the semiconductor pillar 765 can be the gate dielectric of the vertical TFT 763; the conductor 7115 adjacent to dielectric 766 can be the gate of the vertical TFT 763; and source/drains 7111 and 7122 can be the source/drains of the vertical TFT 763. In FIG. 7M, conductor 7115 extends in the x-direction from one of the vertical TFTs 763 to the other and can be a common gate to those vertical TFTs 763 that can wrap completely around dielectrics 766.

As shown in FIG. 7N, the respective vertical TFTs 763 are electrically isolated from each other in the y-direction by dielectrics 7118 and 7120 and isolation region 7109. For example, isolation region 7109 electrically isolates the conductor 7115 that wraps completely around the semiconductor pillar 765 one of respective vertical TFTs 763 from the conductor 7115 that wraps completely around the semiconductor pillar 765 of the other respective vertical TFT 763. Although not shown, in some examples, source/drains 7111 can extend to conductors 774 to electrically couple vertical TFTs 763 to conductors 774, such as in a manner similar to source/drains 6105 in FIG. 6I electrically coupling the vertical TFT 656 to conductor 674.

The term semiconductor can refer to, for example, a material, a wafer, or a substrate, and includes any base semiconductor structure. "Semiconductor" is to be understood as including silicon-on-sapphire (SOS) technology, silicon-on-insulator (SOI) technology, thin-film-transistor (TFT) technology, doped and undoped semiconductors, epitaxial silicon supported by a base semiconductor structure, as well as other semiconductor structures. Furthermore, when reference is made to a semiconductor in the preceding description, previous process steps may have been utilized to form regions/junctions in the base semiconductor structure, and the term semiconductor can include the underlying materials containing such regions/junctions.

The figures herein follow a numbering convention in which the first digit or digits correspond to the drawing figure number and the remaining digits identify an element or component in the drawing. Similar (e.g., the same) elements or components between different figures may be identified by the use of similar digits. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure and should not be taken in a limiting sense.

As used herein, "a number of" or a "quantity of" something can refer to one or more of such things. For example, a number of or a quantity of memory cells can refer to one or more memory cells. A "plurality" of something intends two or more. As used herein, multiple acts being performed concurrently refers to acts overlapping, at least in part, over a particular time period. As used herein, the term "coupled" may include electrically coupled, directly coupled, and/or directly connected with no intervening elements (e.g., by direct physical contact), indirectly coupled and/or connected with intervening elements, or wirelessly coupled. The term coupled may further include two or more elements that co-operate or interact with each other (e.g., as in a cause and effect relationship). An element coupled between two elements can be between the two elements and coupled to each of the two elements.

It should be recognized the term vertical accounts for variations from "exactly" vertical due to routine manufacturing, measuring, and/or assembly variations and that one of ordinary skill in the art would know what is meant by the term "perpendicular." For example, the vertical can correspond to the z-direction. As used herein, when a particular element is "adjacent to" an other element, the particular element can cover the other element, can be over the other element or lateral to the other element and/or can be in direct physical contact the other element. Lateral to may refer to the horizontal direction (e.g., the y-direction or the x-direction) that may be perpendicular to the z-direction, for example.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

What is claimed is:

1. A method, comprising:
   forming a vertical transistor in a region that is between first and second memory cell regions and that comprises a first conductor;
   wherein forming the vertical transistor comprises:
       forming a semiconductor adjacent to the first conductor;
       forming a plurality of openings in the semiconductor to form a semiconductor pillar from the semiconductor between adjacent openings;
       forming respective dielectric plugs in the respective adjacent openings such that the adjacent openings terminate at the respective dielectric plugs;
       forming respective dielectrics in the respective adjacent openings adjacent to opposing sides of the semiconductor pillar such that the respective dielectrics terminate at the respective dielectric plugs; and
       forming respective second conductors in the respective adjacent openings adjacent to portions of the respective dielectrics such that the respective dielectric plugs are between the respective second conductors and the first conductor.

2. The method of claim 1, wherein
   the respective dielectrics form a gate dielectric of the vertical transistor; and
   the respective second conductors form a gate of the vertical transistor.

3. The method of claim 1, further comprising:
   forming a first source/drain in the semiconductor pillar; and
   forming a second source/drain in the semiconductor such that the respective second conductors are between the first and second source/drains.

4. The method of claim 3, wherein the second source/drain couples the vertical transistor to the first conductor.

5. The method of claim 1, further comprising forming an additional dielectric over the top of semiconductor before forming the plurality of openings in the semiconductor.

6. The method of claim 5, further comprising forming a conductive implant in the semiconductor pillar by
   removing a portion of the additional dielectric to expose the top of the semiconductor pillar; and
   conductively doping the semiconductor pillar through the exposed top of the second conductor.

7. The method of claim 1, wherein forming the respective second conductors in the respective adjacent openings adjacent to the portions of the respective dielectrics comprises:
   lining the respective adjacent openings with a conductive liner by forming the conductive liner adjacent to the respective dielectrics and adjacent to the respective conductive plugs; and
   removing the conductive liner from adjacent to the respective conductive plugs and from adjacent other portions of the respective dielectrics such that respective portions of the conductive liner remain adjacent to the portions of the respective dielectrics to form the respective second conductors.

8. The method of claim 1, wherein forming the respective dielectric plugs in the respective adjacent openings, comprises:
   lining the respective adjacent second openings with a dielectric liner;

forming an additional dielectric in the respective adjacent second openings adjacent to the dielectric liner; and removing a portion of the dielectric liner and a portion of the additional dielectric such that respective portions of the dielectric liner and of the additional dielectric remain to form the respective dielectric plugs.

9. The method of claim 8, wherein
the respective dielectrics are respective first dielectrics;
lining the respective adjacent openings with a dielectric liner comprises:
  forming a second dielectric adjacent to the opposing sides of the semiconductor pillar and adjacent to bottoms of the respective adjacent openings;
  forming a third dielectric adjacent to the second dielectric; and
  forming a fourth dielectric adjacent to the third dielectric.

10. A method, comprising:
forming a vertical transistor in a region between first and second memory cell regions and that comprises a first conductor;
wherein forming the vertical transistor comprises:
  forming a semiconductor adjacent to the first conductor;
  forming a first dielectric adjacent to the semiconductor;
  forming an opening in the first dielectric;
  lining the opening with a second dielectric such that the semiconductor is exposed;
  forming a semiconductor pillar in the opening adjacent to the second dielectric and adjacent to the exposed semiconductor; and
  forming a second conductor adjacent to the second dielectric.

11. The method of claim 10, wherein
the second conductor comprises metal; and
the semiconductor and the semiconductor pillar comprise polysilicon.

12. The method of claim 10, wherein
the second dielectric forms a gate dielectric of the vertical transistor; and
the second conductor forms a gate of the vertical transistor.

13. The method of claim 10,
further comprising, before forming the opening, forming first and second isolation regions through the first dielectric stopping on the semiconductor;
wherein forming the opening in the first dielectric comprises forming the opening between the first and second isolation regions.

14. The method of claim 10, wherein
the first dielectric comprises a first dielectric material adjacent to the semiconductor and a second dielectric material adjacent to the first dielectric material; and
forming the second conductor adjacent to the second dielectric comprises:
  removing the second dielectric material to expose the first dielectric material and a portion of the second dielectric; and
  forming the second conductor adjacent to the exposed portion of the second dielectric and the exposed first dielectric material.

15. The method of claim 14, wherein the first dielectric material comprises oxide and the second dielectric material comprises nitride.

16. The method of claim 14, wherein
forming the second conductor adjacent to the second dielectric further comprises removing a portion of the second conductor to expose a portion of the second dielectric; and
the method further comprises forming a third dielectric adjacent to the portion of the second dielectric exposed by removing a portion of the second conductor and adjacent to a remaining portion of the second conductor.

17. The method of claim 10, wherein
the second dielectric wraps completely around the semiconductor pillar; and
the second conductor wraps completely around the second dielectric.

* * * * *